(12) United States Patent
Van Aerde et al.

(10) Patent No.: US 12,362,174 B2
(45) Date of Patent: Jul. 15, 2025

(54) METHOD AND WAFER PROCESSING FURNACE FOR FORMING AN EPITAXIAL STACK ON A PLURALITY OF SUBSTRATES

(71) Applicant: ASM IP Holding B.V., Almere (NL)

(72) Inventors: Steven Van Aerde, Tielt-Winge (BE); Wilco Verweij, Nijkerk (BE); Bert Jongbloed, Oud-Heverlee (BE); Dieter Pierreux, Pepingen (BE); Kelly Houben, Lubbeek (BE); Rami Khazaka, Leuven (BE); Frederick Aryeetey, Phoenix, AZ (US); Peter Westrom, Payson, AZ (US); Omar Elleuch, Litchfield Park, AZ (US); Caleb Miskin, Mesa, AZ (US)

(73) Assignee: ASM IP Holding B.V., Almere (NL)

( * ) Notice: Subject to any disclaimer, the term of this patent is extended or adjusted under 35 U.S.C. 154(b) by 158 days.

(21) Appl. No.: 18/153,272

(22) Filed: Jan. 11, 2023

(65) Prior Publication Data
US 2023/0223255 A1   Jul. 13, 2023

Related U.S. Application Data

(60) Provisional application No. 63/299,196, filed on Jan. 13, 2022.

(51) Int. Cl.
*C30B 25/02* (2006.01)
*C30B 25/16* (2006.01)
(Continued)

(52) U.S. Cl.
CPC ........ *H01L 21/0257* (2013.01); *C30B 25/165* (2013.01); *C30B 29/06* (2013.01);
(Continued)

(58) Field of Classification Search
CPC ....... C30B 25/165; C30B 29/06; C30B 29/52; C30B 29/58; H01L 21/0262; H01L 21/0257; H01L 21/2532
See application file for complete search history.

(56) References Cited

U.S. PATENT DOCUMENTS 5,821,155 A * 10/1998 Izumi ................ H01L 21/02631
   438/479
7,166,528 B2   1/2007 Kim
(Continued)

FOREIGN PATENT DOCUMENTS

| WO | 2005112577 A2 | 12/2005 |
| WO | 2012002994 A1 | 1/2012 |
| WO | 2013122986 A1 | 8/2013 |

OTHER PUBLICATIONS

R.B. Darling, Solid-State Diffusion. EE-527/Winter 2013.
(Continued)

*Primary Examiner* — Robert M Kunemund
(74) *Attorney, Agent, or Firm* — Banner & Witcoff, Ltd.

(57) ABSTRACT

A method and a wafer processing furnace for forming an epitaxial stack on a plurality of substrates is provided. In a preferred embodiment, the method comprises providing the plurality of substrates to a process chamber. A plurality of deposition cycles is executed, thereby forming the epitaxial stack on the plurality of substrates. The epitaxial stack comprises a plurality of epitaxial pairs, wherein the epitaxial pairs each comprises a first epitaxial layer and a second epitaxial layer, the second epitaxial layer being different from the first epitaxial layer. Each deposition cycle comprises a first deposition pulse and a second deposition pulse. The first deposition pulse comprises a provision of a first reaction gas mixture to the process chamber, thereby forming the first epitaxial layer. The second deposition pulse comprises a provision of a second reaction gas mixture to the
(Continued)

process chamber, thereby forming the second epitaxial layer. The first deposition pulse or the second deposition pulse further comprises a provision of a dopant precursor gas to the process chamber.

19 Claims, 4 Drawing Sheets

(51) Int. Cl.
    *C30B 29/06*     (2006.01)
    *C30B 29/52*     (2006.01)
    *C30B 29/68*     (2006.01)
    *H01L 21/02*     (2006.01)
(52) U.S. Cl.
    CPC .............. *C30B 29/52* (2013.01); *C30B 29/68* (2013.01); *H01L 21/02532* (2013.01); *H01L 21/0262* (2013.01)

(56) References Cited

U.S. PATENT DOCUMENTS

| 2016/0049489 A1* | 2/2016 | Wan .................. H01L 29/66545 |
| | | 438/157 |
| 2020/0144058 A1 | 5/2020 | Kohen |
| 2021/0118679 A1* | 4/2021 | Barbosa Lima .. H01L 21/02381 |
| 2021/0327704 A1* | 10/2021 | Kajbafvala ............. C23C 16/24 |

OTHER PUBLICATIONS

Li, Yangyang, et al., "The Effect of Doping on the Digital Etching of Silicon-Selective Silicon-Germanium Using Nitric Acids" Nanomaterials 11, No. 5: 1209, 2021, https://doi.org/10.3390/nano11051209.

* cited by examiner

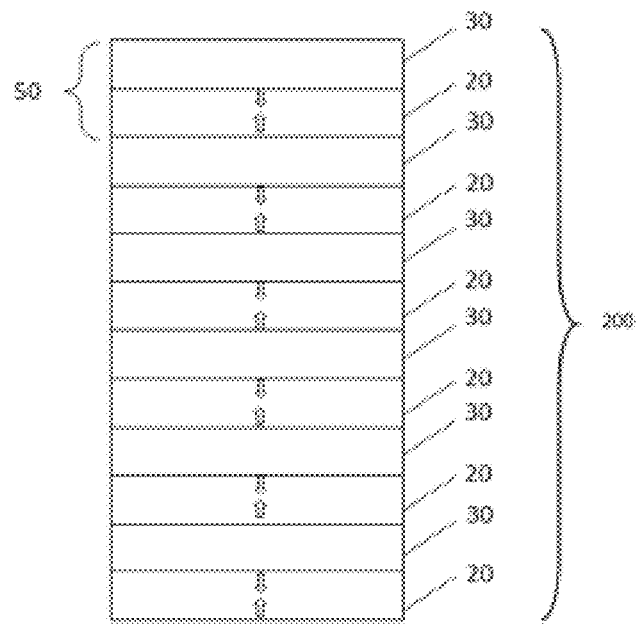
FIG. 3
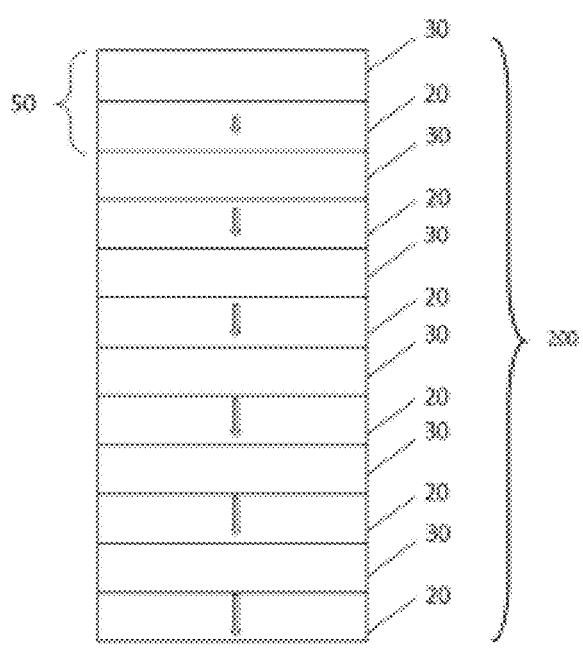 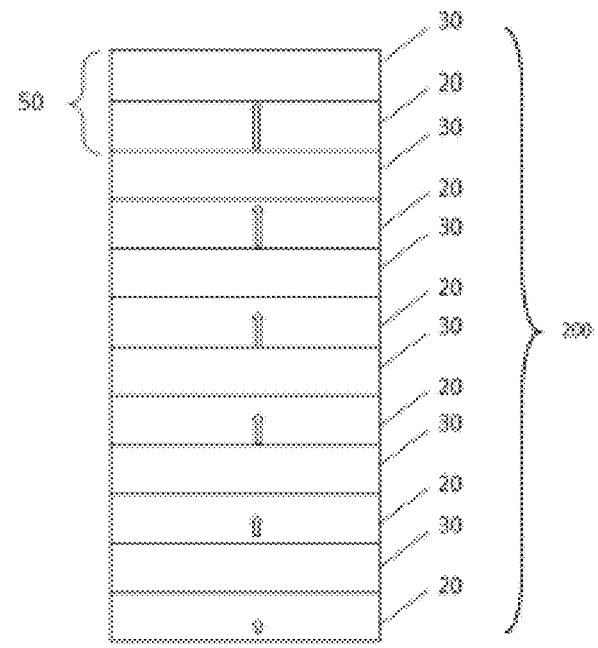
FIG. 4a  FIG. 4b

METHOD AND WAFER PROCESSING FURNACE FOR FORMING AN EPITAXIAL STACK ON A PLURALITY OF SUBSTRATES

TECHNICAL FIELD OF THE DISCLOSURE

The present disclosure relates to the field of processing methods and apparatuses in semiconductor industry. Particularly, it relates to integrated circuit manufacturing methods and to a wafer processing furnace for forming an epitaxial stack on a plurality of substrates.

BACKGROUND OF THE DISCLOSURE

Scaling in semiconductor industry has been the main driver that led to the introduction of new device architectures and their designs together with the developments in materials and processing methods. As scaling is reaching its limits, semiconductor industry is looking into alternatives in order to realize further manufacturing of the devices.

One of these alternatives involves the implementation of monolithic stacking to realize three-dimensional devices. In the field of memory devices, one of the implications of this is on the manufacturing of 3DDRAM devices. Stacking of DRAM dies on top of each other has been pursued for some of the memory applications however, alternative approaches may be required.

There is, therefore, a need for improving the manufacturing of 3DDRAM devices. This may involve providing improved deposition techniques and improved apparatuses to realize the manufacturing of 3DDRAM devices.

SUMMARY OF THE DISCLOSURE

It is an object of the present disclosure to provide improved methods for forming an epitaxial stack on a plurality of substrates and an improved wafer processing furnace. More specifically, certain embodiments may provide improved methods of forming thicker epitaxial stacks on the plurality of substrates, whereby a probability of substrate warpage or substrate bow due to the thicker epitaxial stack is reduced. To at least partially achieve this goal, the present disclosure may provide methods and a wafer processing furnace as defined in the independent claims. Further embodiments of the method and the wafer processing furnace are provided in the dependent claims.

In a first aspect, the present disclosure relates to a method for forming an epitaxial stack on a plurality of substrates. The method may comprise providing the plurality of substrates to a process chamber. A plurality of deposition cycles may be executed, thereby forming the epitaxial stack on the plurality of substrates. The epitaxial stack may comprise a plurality of epitaxial pairs, wherein the epitaxial pairs each may comprise a first epitaxial layer and a second epitaxial layer, the second epitaxial layer being different from the first epitaxial layer. Each deposition cycle may comprise a first deposition pulse and a second deposition pulse. The first deposition pulse may comprise a provision of a first reaction gas mixture to the process chamber, thereby forming the first epitaxial layer. The second deposition pulse may comprise a provision of a second reaction gas mixture to the process chamber, thereby forming the second epitaxial layer. The first or the second deposition pulse may further comprise a provision of a dopant precursor gas to the process chamber.

The inventive method according to the first aspect may allow for forming an epitaxial stack on the plurality of substrates as a result of a batch operation.

The epitaxial stack, according to embodiments of the first aspect, may advantageously comprise plurality of epitaxial layers on the plurality of substrates thanks to the plurality of deposition cycles, thereby allowing to form a thicker epitaxial stack. This may further be advantageous in the manufacturing of semiconductor devices, particularly for 3D DRAM devices, as it may open a route to provide a remedy against the limits of planar scaling of these devices. This may further contribute to improving commercial success.

It may further be an advantage of embodiments of the first aspect that it allows for forming the thicker epitaxial stack on the plurality of substrates, thanks to the execution of the plurality of deposition cycles, whereby a possibility of substrate warpage or substrate bow is reduced. This may further be advantageous in alleviating alignment problems that may occur in subsequent processing steps.

It may further be an advantage of embodiments of the first aspect that it may allow for providing an epitaxial stack, on a plurality of substrates, at lower process temperatures, thereby minimizing a probability of stress relaxation that may be associated with the plurality of epitaxial layers forming the epitaxial stack. This may further provide the advantage of providing improved commercial success.

It may further be an advantage of embodiments of the first aspect that it may allow for reducing cost of semiconductor processing, thereby providing economic processing since plurality of substrates may be processed together in one and the same process run and in one and the same process chamber.

In a second aspect, the present disclosure relates to a method of forming an epitaxial stack on a plurality of substrates. The method may comprise providing the plurality of substrates to a process chamber. The method may also comprise forming the epitaxial stack on the plurality of substrates. The formation of the epitaxial stack may comprise a formation of a first epitaxial layer alternatingly and repeatedly with a formation of a second epitaxial layer, thereby forming a plurality of epitaxial pairs. Each of the first epitaxial layers may comprise a germanium concentration in the range of about 15 atomic % to about 30 atomic percent and a silicon concentration in the range of about 70 atomic % to about 85 atomic %. The second epitaxial layer may comprise a silicon concentration of about 100 atomic % and wherein the first epitaxial layer may further comprise a dopant.

It may be an advantage of embodiments of the second aspect that it allows for forming an epitaxial stack on a plurality of substrates, thereby increasing throughput of wafer processing.

It may further be an advantage of embodiments of the second aspect that an epitaxial stack can be formed having a reduced possibility for substrate warpage or substrate bow thanks to the presence of the dopant in each of the first epitaxial layers, thereby forming a stress-poor epitaxial stack.

It may also be an advantage of embodiments of the second aspect that a thicker epitaxial stack can be formed on the plurality of substrates thanks to the repeating and alternating epitaxial layers, whereby a reduced possibility for substrate warpage or substrate bow can be obtained thanks to the presence of the dopant in each of the first epitaxial layers, thereby forming a thicker stress-poor epitaxial stack. This may further be advantageous in the manufacturing of semiconductor devices, particularly for 3D DRAM devices, which consequently may further contribute to improving commercial success.

It may still be an advantage of embodiments of the second aspect that an epitaxial stack having epitaxial pairs of etch selective epitaxial layers can be formed thanks to the presence of the dopant in the each of the first epitaxial layers.

It may also be an advantage of embodiments of the second aspect that an epitaxial stack having epitaxial pairs of etch selective epitaxial layers can be formed, whereby uniform etching can be achieved thanks to the simultaneous provision of the dopant into each of the first epitaxial layers during its formation.

It may further be an advantage of embodiments of the first aspect that it may allow for providing an epitaxial stack, on a plurality of substrates, at lower process temperatures, thereby minimizing a probability of stress relaxation that may be associated with the plurality of epitaxial layers forming the epitaxial stack. This may further provide the advantage of providing improved commercial success.

It may also be a further advantage of embodiments of the second aspect that it may allow for reducing cost of semiconductor processing, thereby providing economic processing since plurality of substrates may be processed together in one and the same process run and in one and the same process chamber.

In a third aspect, the present disclosure relates to a wafer processing furnace configured to form an epitaxial stack on a plurality of substrates according to embodiments of the first aspect or the second aspect of the present disclosure. This wafer processing furnace may comprise a process chamber extending in a vertical direction. It may also comprise a wafer boat for holding a plurality of substrates, wherein the plurality of substrates are vertically spaced apart. It may also comprise a heater for heating the process chamber. A silane precursor storage module and a germane precursor storage module may be comprised in this wafer processing furnace. The silane precursor storage module may comprise a mono-silane precursor, a high-order straight chain silane precursor, a high order branched silane precursor and a cyclic silane precursor. The germane precursor storage module may comprise a mono-germane precursor and a halo-germane precursor. This wafer processing furnace may also comprise a dopant precursor storage module. The dopant precursor storage module may comprise a dopant precursor comprising a Group IIIA, a Group IVA or a Group VA element-containing compound. A gas providing manifold may further be comprised in this wafer processing furnace operationally connected to the silane precursor storage module, to the germane precursor storage module and to the dopant precursor storage module, this gas providing manifold being further operationally connected to a gas injector, the gas injector being arranged for injecting the one or more silane precursors, the one or more germane precursors, and the dopant precursor.

It may be an advantage of embodiments of the third aspect that it allows for forming an epitaxial stack on a plurality of substrates, thereby increasing throughput of wafer processing.

It may also be an advantage of embodiments of the third aspect that it allows for forming an epitaxial stack on the plurality of substrates, the epitaxial stack offering a reduced possibility for substrate warpage or substrate bow.

It may also be an advantage of embodiments of the third aspect that it allows for forming a thicker epitaxial stack on the plurality of substrates offering a reduced possibility for substrate warpage or substrate bow. This may further be advantageous in the manufacturing of semiconductor devices, particularly for 3D DRAM devices, which consequently may further contribute to improving commercial success.

It may also be a further advantage of embodiments of the third aspect that it may allow for reducing cost of semiconductor processing, thereby providing economic processing since plurality of substrates may be processed together in one and the same process run and in one and the same process chamber.

It may be an advantage of embodiments of the third aspect that it may allow for providing an epitaxial stack, on a plurality of substrates, at lower process temperatures, thereby minimizing a probability of stress relaxation that may be associated with the plurality of epitaxial layers that may be comprised in the epitaxial stack. This may further provide the advantage of providing improved commercial success.

It may further be an advantage of embodiments of the third aspect that it allows for performing a CVD process, whereby a reduced probability for substrate warpage or substrate bow can be obtained on the plurality of substrates.

The present concepts are believed to represent considerable new developments in this field. Departures from prior art practices are included in the present concepts that result in improved methods and improved wafer processing furnaces.

The above and other characteristics, features and advantages of the present disclosure will be clearly understood from the following detailed description that is to be considered together with the drawings included. The reference figures referred to below relate to the drawings included. These drawings illustrate, by way of example, the principles of the disclosure. This description is given for the sake of example only, without limiting the scope of the disclosure.

Particular and preferred aspects of the disclosure are set out in the accompanying independent and dependent claims. Features from the dependent claims may be combined with features of the independent claims. Features from the dependent claims may be combined with features of other dependent claims as appropriate and not as just set out in the claims.

BRIEF DESCRIPTION OF THE FIGURES

The above, as well as additional objects, features and advantages of the present inventive concept, will be better understood through the following illustrative and non-limiting detailed description. Reference is also made to the drawings included. Like reference numbers will be used for like elements in the drawings unless stated otherwise

FIG. 3, FIG. 4a, FIG. 4b, FIG. 5a, and FIG. 5b are schematic cross-sections of the epitaxial stack according to embodiments of the first aspect or the second aspect of the present disclosure after dopant incorporation into the first epitaxial layer.

DETAILED DESCRIPTION OF THE DISCLOSURE

Figure 1:
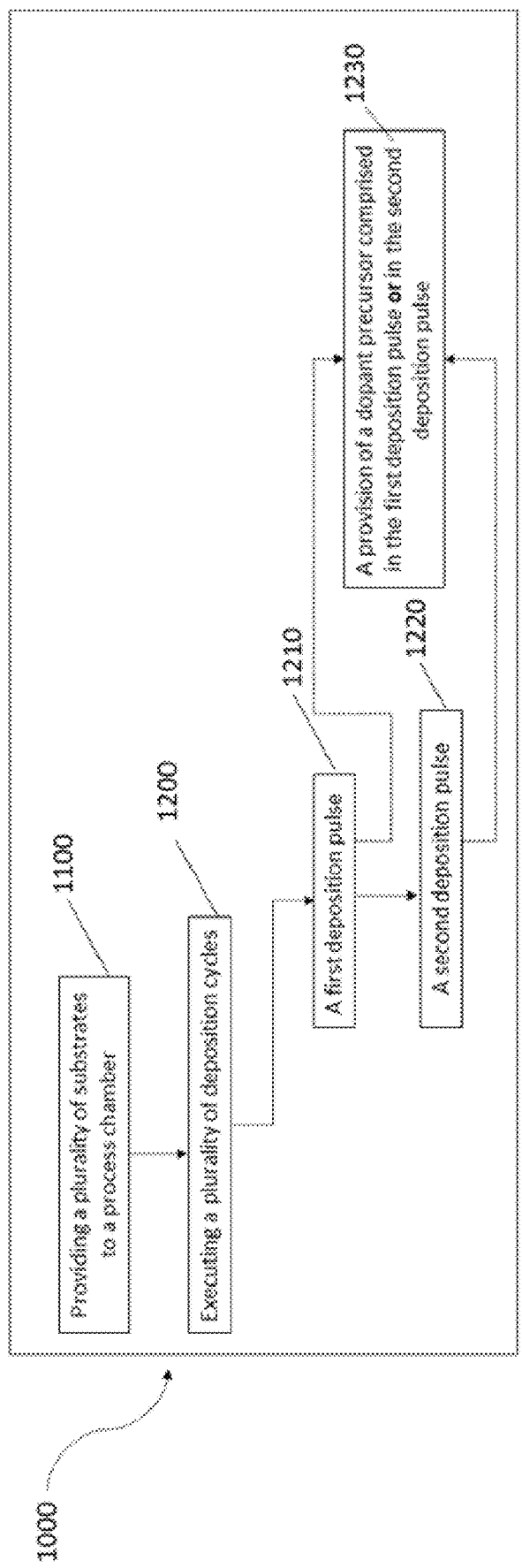
FIG. 1 shows a flowchart of an exemplary method according to embodiments of the first aspect or the second aspect of the present disclosure.

The present disclosure will be described with respect to particular embodiments and with reference to certain drawings. However, the disclosure is not limited thereto but only by the claims. The drawings described are only schematic and are non-limiting. The dimensions do not correspond to actual reductions to practice the disclosure. The size of some of the elements may not be drawn to scale, in the drawings, for illustrative purposes.

The terms first, second, third and the like appearing in the description and the claims, are there to help in distinguishing between similar elements or similar features. Thus, they are not used necessarily for describing an order or a sequence in any manner. It is to be understood that such terms can be interchangeable under suitable conditions. It is thus, further to be understood that the embodiments of the disclosure described in the description are capable of being used in other sequences than the described ones.

It is to be noticed that the term "comprising", used in the claims, should not be interpreted as being restricted to the means listed thereafter. It does not exclude other elements or steps. It is thus, to be interpreted as specifying the presence of the stated features, steps or components as referred to. However, it does not prevent one or more other steps, components, or features, or groups thereof from being present or being added.

Reference throughout the specification to "embodiments" in various places throughout the specification are not necessarily all referring to the same embodiment, but may. Furthermore, the particular features, structures or characteristics maybe combined in any suitable manner, as would be apparent to one of the ordinary skill in the art from the disclosure, in one or more embodiments.

Reference throughout the specification to "some embodiments" means that a particular structure, feature step described in connection with these embodiments is included in some of the embodiments of the present disclosure. Thus, phrases appearing such as "in some embodiments" in different places throughout the specification are not necessarily referring to the same collection of embodiments, but may.

It is to be noticed that the term "comprise substantially" used in the claims indicates that further components than those specifically mentioned can, but not necessarily have to, be present, namely those not materially affecting the essential characteristics of the material, compound, or composition referred to.

It should be understood that in the description of exemplary embodiments of the disclosure, various features of the disclosure are sometimes grouped together in a single embodiment, figure or description in order to help to understand one or more of the inventive aspects. The claims following the detailed description are incorporated into the detailed description, with each claim standing on its own as a separate embodiment of the disclosure.

Some embodiments described herein include some but not other features included in other embodiments. However, combinations of features of different embodiments are meant to be within the scope of the disclosure, and form different embodiments, as would be understood by those in the art. In the claims included, any of the claimed embodiments can, for example, be used in any combination.

The following terms are provided solely to help in the understanding of the disclosure.

As used herein and unless provided otherwise, the term "uniformity problems" refers to one or more of the characteristics of the epitaxial stack that differs across the surface of each of the plurality of substrates such as, for example, thickness.

As used herein and unless provided otherwise, the term "substrate warpage" refers to the difference between the maximum and minimum distances of a substrate, after processing, from a reference surface of the same substrate before processing.

As used herein and unless provided otherwise, the term "substrate bow" refers to the deviation of the center point of the median surface of the substrate after processing from a reference surface of the same substrate before processing.

As used herein and unless provided otherwise, the term "co-flow" refers to the simultaneous provision of more than one precursor to the process chamber.

As used herein and unless provided otherwise, the term "etch selectivity" refers to the ratio of etch rate of the first epitaxial layer (20) with respect to the etch rate of the second epitaxial layer (30) when subjected to the same etching ambient under the same etching conditions.

As used herein and unless provided otherwise, the term "stress-poor epitaxial stack" refers to the fact that the amount of lattice mismatch between the first and the second epitaxial layer is such that lattice induced strain in the epitaxial layers is reduced, thereby making the epitaxial stack stress-poor.

In embodiments, the inert gas may comprise substantially at least one of $N_2$ and one or more noble gases. In alternative embodiments, the inert gas may comprise substantially one or more noble gases such as, for example, Ar, Kr, Ne, He or Xe.

As used herein and unless provided otherwise, the term "batch operation" refers to the processing of plurality of substrates at a time in a process chamber.

The disclosure will now be described by a detailed description of several embodiments of the disclosure. It is to be understood that other embodiments of the disclosure can be configured according to the knowledge of persons skilled in the art without departing from the technical teaching of the disclosure, the disclosure being limited only by the terms of the appended claims.

Figure 2:
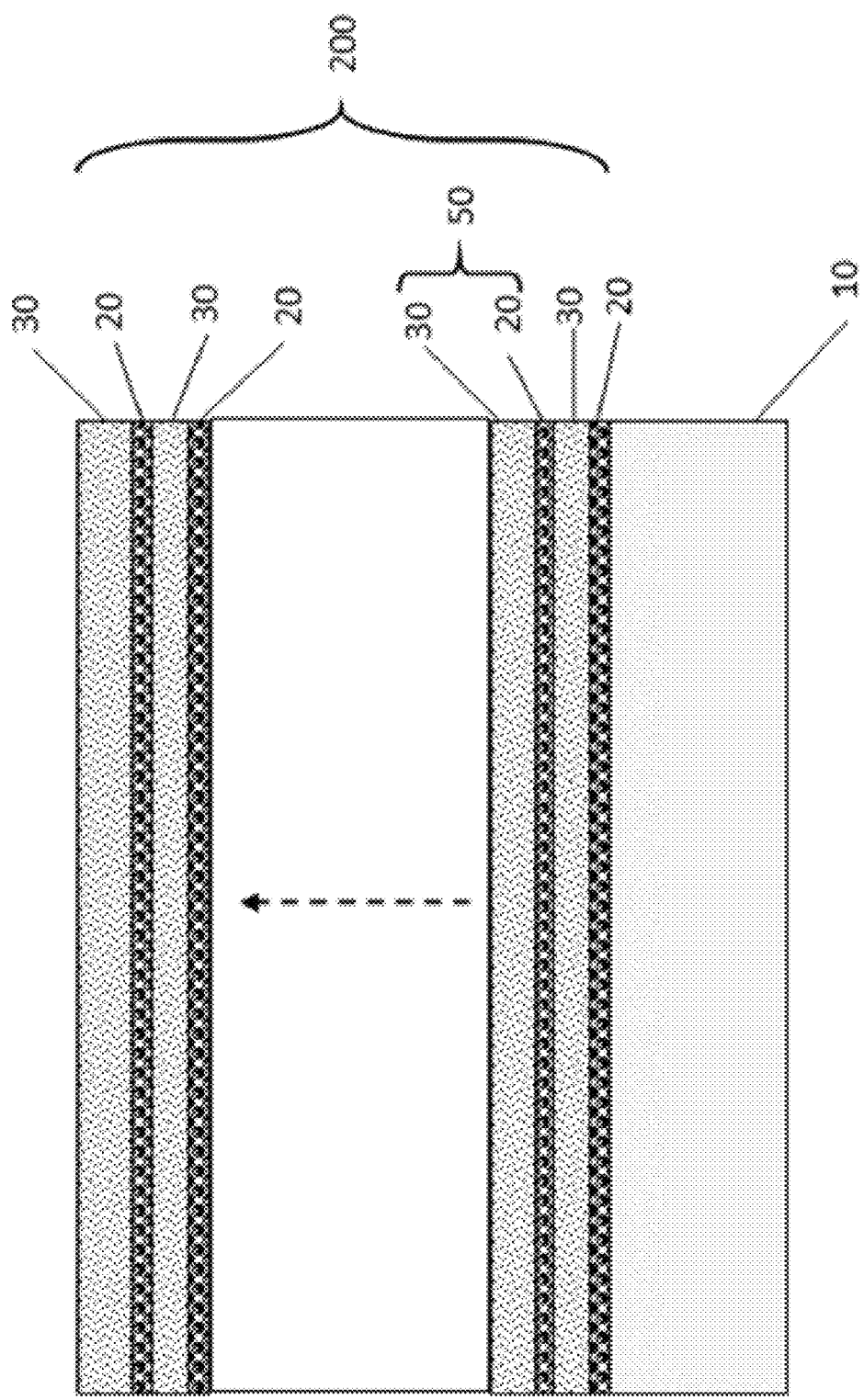
FIG. 2 is a schematic cross-section of the epitaxial stack according to embodiments of the first aspect or the second aspect of the present disclosure.

FIG. 1 presents a flowchart of an exemplary method according to embodiments of the first aspect of the present disclosure. FIG. 2 presents schematic cross-section of the epitaxial stack according to embodiments of the first aspect or the second aspect of the present disclosure.

In a first aspect, the method (1000) of forming an epitaxial stack on a plurality of substrates may comprise providing (1100) the plurality of substrates to a process chamber. This process chamber may be extending in a longitudinal direction. This longitudinal direction may be a vertical direction or a horizontal direction. In embodiments, this process chamber may be comprised in a vertical processing furnace and thus, this process chamber may be extending in a vertical direction. The vertical furnace may provide the advantage of saving cleanroom space compared to a horizontal furnace, where the process chamber typically extends in a horizontal direction. Forming the epitaxial stack on the plurality of substrates may provide the advantage of increasing throughput of the epitaxial deposition process itself. This is due to the fact that wafer processing per unit time may be decreased thanks to the provision of the batch operation. Furthermore, this may further be advantageous in increasing the overall throughput of the semiconductor manufacturing process. The combination of having a vertical furnace and being able to process the plurality of substrates may advantageously allow for economic processing since plurality of substrates may be processed together in one and the same process run and in one and the same process chamber, while saving cleanroom space.

The plurality of substrates may, in embodiments, be semiconductor substrates. The semiconductor substrates may, in embodiments, be Si (111) substrates, or Si (100) substrates. The plurality of substrates may, in embodiments, comprise a semiconductor layer. This semiconductor layer may, in embodiments, be a Si (111) layer or a Si (100) layer. In embodiments, one or more surface layers may be present or may be formed on the substrates.

The method (1000) may further comprise executing a plurality of deposition cycles. As a result of the plurality of deposition cycles, the epitaxial stack (200) is formed on the plurality of substrates (FIG. 2). Each of the deposition cycle of the plurality of deposition cycles (1200) may comprise a first deposition pulse (1210) and a second deposition pulse (1220). The first deposition pulse (1210) may comprise a provision of a first reaction gas mixture to the process chamber, thereby forming the first epitaxial layer (20). The second deposition pulse (1220) may comprise a provision of a second reaction gas mixture to the process chamber, thereby forming the second epitaxial layer (30). The second epitaxial layer (30) may be different than the first epitaxial layer (20). The first epitaxial layer (20) and the second epitaxial layer (30) may be comprised in an epitaxial pair (50). The epitaxial stack (200) may comprise a plurality of such epitaxial pairs (50). While in some embodiments, the second epitaxial layer (30) may be overlaying the first epitaxial layer (20), in alternative embodiments, the second epitaxial layer (30) may be in direct contact with the first epitaxial layer (20). Therefore, in the epitaxial stack (200) each of the first epitaxial layers (20) may appear being sandwiched in between the second epitaxial layers (30) or each of the second epitaxial layers (30) may appear being sandwiched in between the first epitaxial layers (20). A plurality of epitaxial pairs (50) may advantageously be formed on the plurality of substrates thanks to the execution of the plurality of deposition cycles. This may provide the advantage of forming thicker epitaxial stacks on the plurality of substrates. Formation of thicker epitaxial stacks may be advantageous regarding the manufacturing of, particularly, 3DDRAM devices as there is a need to provide a remedy to cope against the challenges relating to the limits of planar scaling of these devices. This may, therefore, advantageously lead to achieving commercial success.

In an embodiment of the disclosed method (1000), the first deposition pulse (1210) or the second deposition pulse (1220) may further comprise a provision (1230) of a dopant precursor gas to the process chamber. The provision (1230) of the dopant precursor gas may lead to the presence of dopant atoms in the first epitaxial layer (20) or in the second epitaxial layer (30). The presence of dopant may advantageously help to equilibrate the stress in the first epitaxial layer (20) or in the second epitaxial layer (30) of the plurality of epitaxial pairs (50) that may lead to stress build up in the epitaxial stack (200), particularly when thicker epitaxial stacks are deposited on the plurality of substrates. This stress build-up may lead to substrate warpage or substrate bow. When the substrate is bowed or warped, the crystal planes of the epitaxial layers may have curvature or may be free of curvature. However, in either case, when substrate warpage or substrate bow exists, it may lead to challenges or even lead to problems, in the subsequent processing steps such as, for example, alignment problems in lithography, thickness variations across the substrate surface after further deposition processes, non-uniformities in etching originating from the thickness variations and wafer handling issues. These challenges or problems may run the risk of affecting process quality, decreasing process yield, decreasing process throughput and eventually an overall decrease in manufacturing yield and overall decrease in manufacturing throughput. Therefore, the presence of dopant in the first epitaxial layer (20) or in the second epitaxial layer (30) may advantageously help to alleviate these challenges or problems.

In embodiments, the epitaxial stack (200) may, advantageously, be a stress-poor epitaxial stack thanks to the presence of dopants in the first epitaxial layer (20) or in the second epitaxial layer (30) of the plurality of epitaxial pairs (50). In embodiments, the provision of the dopant precursor gas to the process chamber may thus, reduce stress in the epitaxial stack (200). The provision of the dopant precursor gas to the process chamber introduces dopant into the first (20) or into the second (30) epitaxial layer depending on when it is provided. The presence of the dopant in the first (20) or the second (30) epitaxial layer may advantageously reduce the lattice mismatch between the subsequent epitaxial layers of the epitaxial stack (200), thereby leading to a reduction in stress relaxation of the epitaxial layers, within which it is incorporated, of the epitaxial stack.

In other words, this may imply that even though stress may still exist in the epitaxial stack (200), due to the reduced lattice mismatch thanks to the presence of the dopant in the first (20) or the second (30) epitaxial layer, the lattice induced strain is reduced, thereby also minimizing a probability of substrate warpage or substrate bow.

In embodiments, the provision of the dopant precursor gas may be performed simultaneously with the provision of the first reaction gas mixture or simultaneously with the provision of the second reaction gas mixture. Simultaneous provision of the dopant precursor gas may, in other words, be referred to as co-flowing the dopant precursor gas together with the first reaction gas mixture or together with the second reaction gas mixture into the process chamber. This may be advantageous in terms of the doping characteristics such that a uniform doping profile and a uniform doping concentration can be achieved within the epitaxial layer as the growth and the doping is happening at the same time. This may further be advantageous since it may help to reduce lattice mismatch between the first (20) and the second epitaxial layer (30). This therefore, may delay the stress build up in the epitaxial stack (200) as the thickness of the epitaxial stack is increasing, thereby minimizing the probability of substrate warpage or substrate bow.

In some embodiments, the simultaneous provision of the dopant precursor gas may be configured such that the dopant concentration in the first (20) or in the second epitaxial layer (30) is increasing towards the center in a direction extending away from its lower or from its upper interface towards the center, so that a gradual and opposing stress distribution can be obtained throughout the thickness of the epitaxial layer. In other words, the concentration of the dopant may be graded within the first (20) or within the second epitaxial layer (30) such that the dopant concentration is higher in the center portion of the first (20) or the second (30) epitaxial layer and lower in an upper portion and in a lower portion.

In some embodiments, the simultaneous provision of the dopant precursor gas may be performed with the provision of the first reaction gas mixture or the second reaction gas mixture in such a way that the concentration of the dopant within the first (20) or the second epitaxial layer (30) is increasing along the epitaxial stack extending away from an upper portion of the epitaxial stack towards its lower portion.

In alternative embodiments, the simultaneous provision of the dopant precursor gas may be performed in such a way that a group of epitaxial pairs (50), moving from the lower portion towards the center portion of the epitaxial stack (200), such as for example, from "n=1" to "n=x", x being the epitaxial pair (50) situated in the center or within the center portion of the epitaxial stack (200), may have a decreasing dopant concentration within the first (20) or the second (30) epitaxial layer while another group of epitaxial pairs (50), moving from the center portion towards the upper portion of the epitaxial stack (200), such as for example, from "n=x+1" to "n=y", y being the top most epitaxial pair (50) of the epitaxial stack (200), may have an increasing dopant concentration within the first (20) or the second (30) epitaxial layer. In other words, the dopant concentration within the first (20) or the second (30) epitaxial layer may change in an opposite behavior within the lower portion and the upper portion of the epitaxial stack (200) with reference to the center of the epitaxial stack (200).

In further alternative embodiments, the simultaneous provision of the dopant precursor gas may be performed in such a way that a group of epitaxial pairs (50), moving from the lower portion towards the center portion of the epitaxial stack (200), such as for example, from "n=1" to "n=x", x being the epitaxial pair (50) situated in the center or within the center portion of the epitaxial stack (200), may have an increasing dopant concentration within the first (20) or the second (30) epitaxial layer while another group of epitaxial pairs (50), moving from the center portion towards the upper portion of the epitaxial stack (200), such as for example, from "n=x+1" to "n=y", y being the top most epitaxial pair (50) of the epitaxial stack (200), may have a decreasing dopant concentration within the first (20) or the second (30) epitaxial layer. In other words, the dopant concentration within the first (20) or the second (30) epitaxial layer may change in an opposite behavior within the lower portion and the upper portion of the epitaxial stack (200) with reference to the center of the epitaxial stack (200).

The number of epitaxial pair groups having such opposite dopant concentration within the first (20) or within the second epitaxial layer (30) may at least be 2. In these embodiments, the at least 2 groups may be positioned in the first half and in the second half of the epitaxial stack (200), respectively.

In embodiments, the first epitaxial layer (20) may comprise a first semiconductor material and the provision of the first reaction gas mixture may comprise providing first semiconductor material precursors. The second epitaxial layer may comprise a second semiconductor material, the second semiconductor material being different than the first semiconductor material and the provision of the second reaction gas mixture may comprise providing a second semiconductor material precursor and the dopant precursor gas may be provided simultaneously with the provision of the first reaction gas mixture.

The provision of the dopant precursor gas with the provision of the first reaction gas mixture leads to the presence of dopant in the first epitaxial layer (20). The simultaneous provision of the dopant precursor gas may advantageously allow for the dopant to be uniformly distributed throughout the first epitaxial layer (20) during its growth. Furthermore, in some embodiments, the first epitaxial layer (20) is to be used as a sacrificial layer in the epitaxial stack (200). In other words, this first epitaxial layer (20) is, in some embodiments, to be removed from the epitaxial stack (200) during one of the subsequent processes. Therefore, while presence of the dopant in the first epitaxial layer (20) may be advantageous to level out the stress build-up throughout the epitaxial stack (200), the removal of the first epitaxial layer due to its being the sacrificial layer may advantageously leave no dopant in the semiconductor structure to be made through the subsequent processes. Furthermore, the presence of the dopant in the first epitaxial layer (20) may provide etch selectivity of the first epitaxial layer (20) towards the second epitaxial layer (30), thereby improving the etching process.

In some embodiments, the simultaneous provision of the dopant precursor gas may be configured such that the dopant concentration in the first (20) epitaxial layer is increasing towards the center in a direction extending away from its lower or from its upper interface towards the center, so that a gradual and opposing stress distribution can be obtained throughout the thickness of the first epitaxial layer (20). In other words, the concentration of the dopant may be graded within the first (20) epitaxial layer such that the dopant concentration is higher in the center portion of the first (20) epitaxial layer and the dopant concentration is lower in its upper portion and in its lower portion. This is schematically represented in FIG. 3.

This may advantageously help for accommodating the lattice mismatch between the first epitaxial layer (20) and the second epitaxial layer (30). Furthermore, it may advantageously allow for reducing the probability of diffusion of the dopant into the adjacent second epitaxial layers (30) at the top and at the bottom of the first epitaxial layer (20). Reducing the probability of diffusion of the dopant into the adjacent second epitaxial layer (30) at the top and at the bottom of the first epitaxial layer (20) may be advantageous since it may allow for maintaining the etch selectivity of the first epitaxial layer (20) towards the second epitaxial layer (30) in case the second epitaxial layer (30) is to be removed from the epitaxial stack (200) in one of the subsequent processes.

In some embodiments, the simultaneous provision of the dopant precursor gas may be performed with the provision of the first reaction gas mixture in such a way that the concentration of the dopant, within the first (20) epitaxial layer (30), is increasing or decreasing along the epitaxial stack (200) extending away from an upper portion of the epitaxial stack (200) towards its lower portion. This is schematically represented in FIG. 4a and FIG. 4b, respectively.

This may allow for tailoring the etch characteristics of the first epitaxial layer (20) selectively towards the second epitaxial layer (30) in one of the subsequent processes. Despite the fact that the presence of dopant in the first epitaxial layer (20) enhances its etch selectivity towards the second epitaxial layer (30), some dopants may slow down the etch rate of the first epitaxial layer (20). Besides, etch behavior and thus the etch profile of the first epitaxial layer (20) may differ along the epitaxial stack as a function of the etch ambient that it is exposed to and as a function of the chamber that etching is taking place within, such as for example higher etching in the lower portion of the epitaxial stack compared to the upper position or vice versa. Therefore, a dopant concentration profile as schematically represented in FIG. 4a or FIG. 4b may help to compensate for these factors to allow for providing the etch selectivity of the first epitaxial layer (20) towards the second epitaxial layer (30), whereby a balanced etch behavior and thus a balanced etch profile regarding the etching of the first epitaxial layer (20) can be achieved throughout the epitaxial stack (200).

In alternative embodiments, the simultaneous provision of the dopant precursor gas may be performed in such a way that a group of epitaxial pairs (50) moving from the lower portion towards the center portion of the epitaxial stack (200), such as for example, from "n=1" to "n=x", x being the epitaxial pair (50) situated in the center or within the center portion of the epitaxial stack (200), may have a decreasing dopant concentration within the first (20) or the second (30) epitaxial layer, while another group of epitaxial pairs (50), moving from the center portion towards the upper portion of the epitaxial stack (200), such as for example, from "n=x+1" to "n=y", y being the top most epitaxial pair (50) of the epitaxial stack (200), may have an increasing dopant concentration within the first (20) or the second (30) epitaxial layer. In some embodiments, x is from at least 25 to at most 225 such as for example 64, 128, but not limited thereto. It is to be understood that x depends on the total number of epitaxial pairs in the epitaxial stack. Therefore, depending on the total number of epitaxial pairs, x may correspond to the central epitaxial pair or may correspond to the epitaxial pair located within the central region of the epitaxial stack along its height. In some embodiments, y is from at least 50 to at most 550, such as for example 64, 128 or 256, but not limited thereto.

Figure 5A:
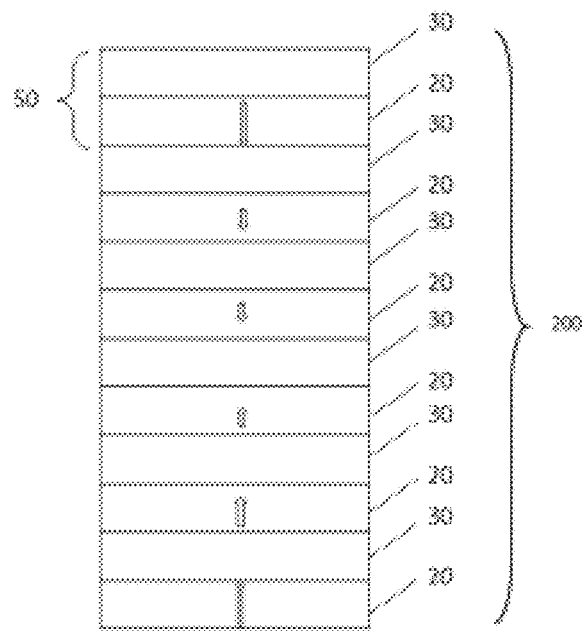

In other words, the dopant concentration within the first (20) or the second (30) epitaxial layer may change in an opposite behavior within the lower portion and the upper portion of the epitaxial stack (200) with reference to the center of the epitaxial stack (200). This is schematically represented in FIG. 5a.

In further alternative embodiments, the simultaneous provision of the dopant precursor gas may be performed in such a way that a group of epitaxial pairs (50), moving from the lower portion towards the center portion of the epitaxial stack (200), such as for example, from "n=1" to "n=x", x being the epitaxial pair (50) situated in the center or within the center portion of the epitaxial stack (200), may have an increasing dopant concentration within the first (20) or the second (30) epitaxial layer while another group of epitaxial pairs (50), moving from the center portion towards the upper portion of the epitaxial stack (200), such as, for example, from "n=x+1" to "n=y", y being the top most epitaxial pair (50) of the epitaxial stack (200), may have a decreasing dopant concentration within the first (20) or the second (30) epitaxial layer. In some embodiments, x is from at least 25 to at most 225, such as for example 64 or 128, but not limited thereto. It is to be understood that x depends on the total number of epitaxial pairs in the epitaxial stack. Therefore, depending on the total number of epitaxial pairs x may correspond to the central epitaxial pair or may correspond to the epitaxial pair located within the central region of the epitaxial stack along its height. In some embodiments, y is from at least 50 to at most 550, such as for example 64, 128 or 256, but not limited thereto.

Figure 5B:
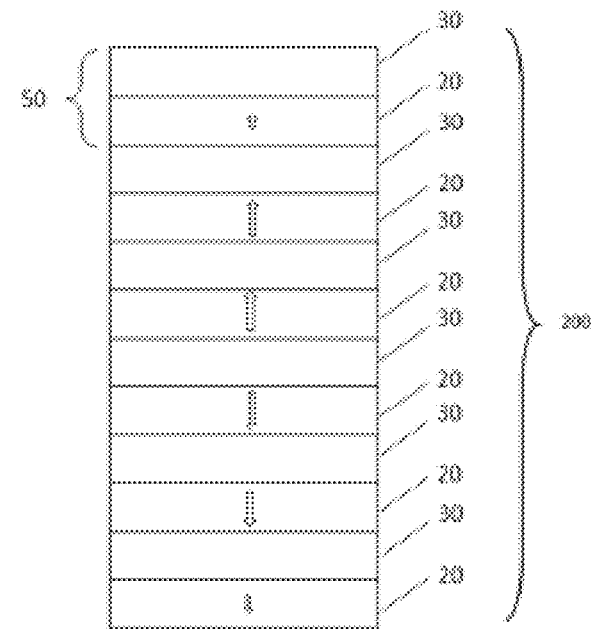

In other words, the dopant concentration within the first (20) or the second (30) epitaxial layer may change in an opposite behavior within the lower portion and the upper portion of the epitaxial stack (200) with reference to the center of the epitaxial stack (200). This is schematically represented in FIG. 5b.

These alternative embodiments may offer the advantage of allowing for optimized etch integration when etching the first epitaxial layer (200) selective to the second epitaxial layer (30) in one of the subsequent processes. This may further be advantageous in cases, where enhanced etching may exist around the neighborhood of the upper and around the neighborhood of the lower portion of the epitaxial stack (200), which may be due to the etch ambient and/or the etch chamber. Thus, the higher (FIG. 5a) dopant concentration or the lower (FIG. 5b) dopant concentration in the first epitaxial layers (20) around the neighborhood of the upper and around the neighborhood of the lower portion of the epitaxial stack (200) may compensate for the etch rate difference of the first epitaxial layers (20) around the center of the epitaxial stack (200) having a lower (FIG. 5a) or a higher (FIG. 5b) dopant concentration.

In embodiments, the concentration of the germanium containing compound comprised in the first semiconductor material precursors may be supplied to the process chamber in range of 1 volume % to 100 volume %. It is to be understood that this is the volume percentage of the germanium containing compound that may be provided to a gas supply line running from a germane precursor storage module to a gas providing manifold comprised in the vertical processing furnace. In embodiments, the concentration of the germanium containing compound supplied to the process chamber may be at least from 1 volume % to at most 20 volume % or at least from 20 volume % to at most 40 volume % or at least from 40 volume % to at most 60 volume % or at least from 60 volume % to at most 80 volume % or at least from 80 volume % to at most 100 volume %.

In some embodiments, the concentration of the germanium containing compound comprised in the first semiconductor material precursors supplied to the process chamber may be 10 volume %.

The concentration of the germanium containing compound may further be adjusted, such as for example, it may be diluted by the use of an inert carrier gas. In other words, an inert gas may be provided in the process chamber. In embodiments, the inert gas may comprise substantially $N_2$. In some embodiments, the inert gas may comprise substantially of one or more noble gases such, for example, Ar, Xe, He, Ne and Kr. In some embodiments, the inert gas may comprise substantially of at least one of $N_2$ and one or more of noble gases.

In embodiments, the concentration of the first silicon-containing compound comprised in the first semiconductor material precursors may be supplied to the process chamber at 100 volume %. It is to be understood that this is the volume percentage of the silicon-containing compound that may be provided to a gas supply line running from a silicon precursor storage module to the gas providing manifold comprised in the vertical processing furnace. The adjustment of the concentration of the first silicon-containing compound comprised in the first semiconductor material precursors, may in some embodiments, be done optionally. This may, in these embodiments, be done by a provision of an inert gas in the process chamber. In embodiments, the inert gas may comprise substantially $N_2$. In some embodiments, the inert gas may comprise substantially of one or more noble gases such, for example, Ar, Xe, He, Ne and Kr. In some embodiments, the inert gas may comprise substantially of at least one of $N_2$ and one or more of noble gases.

Therefore, in embodiments, the provision of the first reaction gas mixture may comprise providing the germanium containing compound, to the gas providing manifold through the gas supply line from the germane precursor storage module, at a concentration in the range of 1 volume % to 100 volume % and providing the first silicon-containing compound, to the gas providing manifold through the gas supply line from the silicon precursor storage module, at a concentration of 100 volume %, whereby the germanium containing compound and first silicon-containing compound may further be provided to the process chamber.

In some embodiments, the provision of the first reaction gas mixture may comprise providing the germanium containing compound, to the gas providing manifold through the gas supply line from the germane precursor storage module, at a concentration of 10 volume % and providing the first silicon-containing compound, to the gas providing manifold through the gas supply line from the silicon precursor storage module, at a concentration of 100 volume %, whereby the germanium containing compound and first silicon-containing compound may further be provided to the process chamber. In embodiments, the concentration of the second silicon-containing compound comprised substantially in the second semiconductor material precursor, thereby forming the second epitaxial layer (30) may be provided to the process chamber at 100 volume %. It is to be understood that this is the volume percentage of the second silicon containing compound that may be provided to a gas supply line running from the silicon precursor storage module to the gas providing manifold comprised in the vertical processing furnace. The adjustment of the concentration of the second silicon-containing compound comprised substantially in the second semiconductor material precursor, may in some embodiments, be done optionally.

Therefore, in these embodiments, an inert gas may be provided in the process chamber. In embodiments, the inert gas may comprise substantially $N_2$. In some embodiments, the inert gas may comprise substantially of one or more noble gases such, for example, Ar, Xe, He, Ne and Kr. In some embodiments, the inert gas may comprise substantially of at least one of $N_2$ and one or more of noble gases.

In embodiments, the dopant precursor gas may be at least one of a Group IIIA, a Group IVA or a Group VA element-containing compound. The dopant that may be incorporated into the epitaxial layer by at least one of these compounds may advantageously be help for reducing the probability of substrate warpage or substrate bow by equilibrating the stress in the first epitaxial layer (20), thereby reducing a probability of stress build-up throughout the epitaxial layer.

In embodiments, the Group IIIA element-containing compound may be a boron-containing compound. Boron that will be incorporated in the epitaxial layer, preferably in the first epitaxial layer (20), as the dopant is a dopant that is compatible with epitaxial growth and it can advantageously be incorporated when processing the plurality of substrates. In these embodiments, the boron-containing compound may be a borane, a boron trihalide or an alkylborane. The borane has a general formula of $B_xH_y$, wherein x and y are integers. In some embodiments, x is from at least 1 to at most 12. In embodiments the borane may include monoborane, diborane, triborane, tetraborane and pentaborane or mixtures thereof. The alkylborane may, in embodiments, include dimethlyborane, diethylborane, trimethylborane, triethylborane, mixtures thereof or other alkyl boranes having a general formula of $R_xBH_{3-x}$, with R representing an alkyl group such as ethyl, methyl, butyl or propyl and with x ranging from 0 to 3.

The boron trihalide, has a general formula of $BX_3$, wherein X is a halogen. In embodiments, the boron trihalide may be $BCl_3$.

In some embodiments, the Group IIIA element-containing compound may be an aluminum-containing compound or a gallium-containing compound. The aluminum-containing compound or the gallium-containing compound may be halogenated and/or alkylated derivatives having a general formula of $R_nMX_{3-n}$, n being 0, 1, 2 or 3, M being aluminum or gallium and R being an alkyl group of ethyl, methyl, butyl or propyl and X being Cl or F. In these embodiments, aluminum-containing or gallium-containing compounds may be triethyl aluminum, trimethylaluminum, aluminum chloride, trimethyl aluminum chloride, triethylgallium, trimethylgallium, gallium chloride and dimethyl gallium chloride.

In embodiments, the Group IVA element-containing compound may be a carbon-containing compound. The carbon containing compound may, in some embodiments, be selected from alkanes, alkenes, alkynes, cyclic alkynes, cyclic alkenes, cyclic alkanes, aromatic hydrocarbons and derivatives thereof. In some embodiments, the carbon containing compound may be selected from alkanes, alkenes, alkynes, cyclic alkynes, cyclic alkenes, cyclic alkanes, aromatic hydrocarbons, and derivatives thereof, the alkyl group being ethyl, methyl, butyl and propyl.

The carbon-containing compound may, in embodiments, be selected from the group consisting of CO, $CF_4$, $CH_2O$, $CH_4$, $C_2F_4H_2$, $COF_2$ and $C_2H_4$.

In some embodiments, the carbon-containing compound may be $C_2H_4$. This may provide the advantage of allowing better carbon dopant incorporation into the epitaxial layer as it is particularly suitable for use at temperature ranges of forming the epitaxial stack (200).

In embodiments, the Group-VA element-containing compound may be a pnictogen hydride. The pnictogen hydride has a formula of $XH_3$, X being a pnictogen. In embodiments, the pnictogen hydride may be selected from the group consisting of arsine ($AsH_3$), phosphine ($PH_3$), stibine ($SbH_3$) and mixtures thereof. In some embodiments, alkylphosphines, having the formula $R_xPH_{3-x}$, where x ranges from zero to 3 and R is an alkyl selected from the group consisting of ethyl, methyl, butyl or propyl, may be used as the Group-VA element-containing compound. The arsenic, antimony, or phosphorus dopant incorporated in the epitaxial layer, preferably in the first epitaxial layer (20), thus, is compatible with epitaxial growth and it can advantageously be incorporated when processing the plurality of substrates. In some embodiments, alkylphosphines may be selected from the group consisting of diethylphosphine, triethylphosphine, dimethylphosphine, trimethylphosphine and mixtures thereof.

The concentration of the dopant in the first epitaxial layer (20) may play an important role in tuning the stress in the epitaxial stack (200), thereby reducing the probability of substrate warpage or substrate bow. Furthermore, following the formation of the epitaxial stack (200), the concentration of the dopant may, further, play a role on the selectivity of the etch process during the removal of this first epitaxial layer (20) with respect to the second epitaxial layer (30). This may occur in either or both of two ways. On one hand, it is to be understood that in order to facilitate selective etching, the dopant remains confined in the first epitaxial layer (20) and, preferably does not diffuse into the second epitaxial layer (30). Therefore, the concentration of the dopant in the first epitaxial layer (20) may, advantageously, be configured such that its diffusion is limited within the first epitaxial layer (20) and that it preferably does not diffuse into the second epitaxial layer (30). On the other hand, the concentration of the dopant, preferably confined in the first epitaxial layer (20) may, advantageously, be configured further such that it allows for selective etching of the first epitaxial layer (20) with an etch selectivity as close to 1 as possible. Etch selectivity obtained may, advantageously, allow for controlling the etch rate, and may thus, help for obtaining an atomically lower surface roughness. The surface roughness can be measured by Atomic Force Microscopy (AFM).

Without wishing to be bound by theory, it is to be understood that at lower dopant concentrations, the diffusion constant of the dopant in the first epitaxial layer (20) may be considered as a constant at a given temperature. Therefore, the concentration of the dopant may be further configured for optimizing the extent of diffusion in the first epitaxial layer (30) depending on the dopant being a fast diffuser or a slow diffuser.

It is to be understood that some dopant types may segregate to the surface of the first epitaxial layer (20) upon being incorporated into the first epitaxial layer (20). This may originate from the fact that the lattice parameter of the dopant atom and lattice parameter of at least one of the atoms making up the first semiconductor material comprised in the first epitaxial layer (20) may have a similar value. These dopant types may, however, be helpful in tuning the etch selectivity of the first epitaxial layer (20) towards the second epitaxial layer (30) in one of the subsequent processes.

In embodiments, therefore, the first epitaxial layer (20) may have a dopant concentration of less than 10 atomic %. This may help to equilibrate the stress in the first epitaxial layer (20) therefore, further leading to a reduction in the probability of stress build-up in the epitaxial stack (200) formed.

In embodiments, the concentration of the dopant in the first epitaxial layer (20) may be from at least 1 atomic % to at most 10 atomic % or from at least 1 atomic % to at most 2 atomic % or from at least 2 atomic % to at most 4 atomic % or from at least 4 atomic % to at most 6 atomic % or from at least 6 atomic % to at most 8 atomic % or from at least 8 atomic % to at most 10 atomic %.

In embodiments, the dopant precursor gas may be provided in the process chamber in the presence of a carrier gas. This may help to dilute the doping concentration. This may then lead to a better control in the doping dose within the epitaxial layer. In embodiments, the inert gas may comprise substantially $N_2$. In some embodiments, the inert gas may comprise substantially of one or more noble gases such, for example, Ar, Ne, He, Xe and Kr. In some embodiments, the inert gas may comprise substantially of at least one of $N_2$ and one or more of noble gases.

In embodiments, the first semiconductor material precursors may comprise a germanium-containing compound and a first silicon containing compound and the second semiconductor material precursor may comprise substantially a second silicon-containing compound.

In embodiments, the germanium-containing compound comprised in the first semiconductor material precursors may be a germane. In some embodiments, the germane may be a mono-germane. In some embodiments, the germane may be a high order germane. This higher order germane may be a di-germane ($Ge_2H_6$), a tri-germane ($Ge_3H_8$) or a tetra-germane ($Ge_4H_{10}$) as well as other higher order germanes having a general formula of $Ge_xH_{2x+2}$.

In some embodiments, the germane may be a halo-germane. This halo-germane has the formula $GeH_nX_{4-n}$, where X is a halogen such as, F, Cl, Br or I and where n is an integer from 0 to 3. Therefore, this halo-germane may, in embodiments, be a fluoro-germane, a chloro-germane, a bromo-germane or an iodo-germane. The chloro-germane may, in embodiments, be chosen from $GeCl_3H$, $GeCl_4$, $GeClH_3$, $GeCl_2H_2$, and $Ge_2ClH_5$.

In embodiments, the germanium-containing compound comprised in the first semiconductor material precursors may be at least one of mono-germane or a halo-germane. In embodiments, the halo-germane may be $GeCl_4$.

In embodiments, the first silicon-containing compound comprised in the first semiconductor material precursors and/or the second silicon-containing compound comprised substantially in the second semiconductor material precursor may be a mono-silane, a high order silane or a cyclic silane.

Therefore, in some embodiments, the first silicon-containing compound comprised in the first semiconductor material precursors and the second silicon-containing compound comprised substantially in the second semiconductor material precursor may be a mono-silane, a high order silane or a cyclic silane.

In some embodiments, the first silicon-containing compound comprised in the first semiconductor material precursors or the second silicon-containing compound comprised substantially in the second semiconductor material precursor may be a mono-silane, a high order silane or a cyclic silane.

High order silanes have the advantage of providing a lower temperature epitaxial layer formation. This is thanks to the presence of the low energy Si—Si bonds.

The cyclic silanes have a ring structure, thereby having lower Si—Si and Si—H bond strengths. This may therefore provide the advantage of forming epitaxial layers at lower deposition temperatures.

In embodiments, the high order silane may be a high order straight chain silane or a high order branched silane.

In embodiments, the first silicon-containing compound comprised in the first semiconductor material precursors and the second silicon-containing compound comprised substantially in the second semiconductor material precursor may thus, be a silane, having a general molecular formula of $Si_nH_{2n+2}$, n being an integer from at least 1 to at most 20.

In some embodiments, the silane may be a mono-silane ($SiH_4$).

In some embodiments, the silane may be a high order straight chain silane, having a general molecular formula of $Si_nH_{2n+2}$, n being an integer from at least 2 to at most 20 such as, for example, a di-silane ($Si_2H_6$), a trisilane ($Si_3H_8$), a tetra-silane ($Si_4H_{10}$), a pentasilane ($Si_5H_{12}$), a hexasilane ($Si_6H_{14}$), a heptasilane ($Si_7H_{16}$), octasilane ($Si_8H_{18}$), non-asilane ($Si_9H_{20}$), decasilane ($Si_{10}H_{22}$) or other high order straight chain silanes according to the general molecular formula of $Si_nH_{2n+2}$ and combinations thereof. In some embodiments, the first silicon-containing compound or the second silicon-containing compound may be a combination of the mono-silane and at least one of the high order straight chain silanes.

In embodiments, the high order straight chain silane may be trisilane.

In embodiments, the first silicon-containing compound comprised in the first semiconductor material precursors or the second silicon-containing compound comprised substantially in the second semiconductor material precursor may be a cyclic silane or a high order branched silane.

The cyclic silane or in other words, the cyclo-silane has a general molecular formula of $Si_nH_{2n}$, where n is an integer from at least 3 to at most 20, or from at least 5 to at most 10, and it is a silane with a ring structure.

In embodiments, the cyclic silane may be a cyclohexasilane. Cyclohexasilane is a high order silane, however it has a ring structure, thereby having lower Si—Si and Si—H bond strengths. This may therefore provide the advantage of forming epitaxial layers at lower deposition temperatures. By enabling the formation of epitaxial layers at lower deposition temperatures, may advantageously allow for reducing the probability of stress relaxation in the epitaxial stack, particularly when the thickness of the epitaxial stack is increased. Other cyclic silanes that may be used include cyclotrisilane ($Si_3H_6$), cyclotetrasilane ($Si_4H_8$), cyclopentasilane ($Si_5H_{10}$), cyclohexasilane ($Si_6H_{12}$), cycloheptasilane ($Si_7H_{14}$) or combinations thereof. Silyl substituted cyclic silanes may, in some embodiments, be used including silyl cyclotetrasilane, 1,2-disilylcyclopentasilane, 1,3-disilylcyclohexasilane, silylhexasilane and combinations thereof.

High order branched silanes have a general formula $Si_nH_{2n+2}$, where n is an integer from at least 4 to at most 20. The high order branched silane may, in embodiments, be neopentasilane. Neopentasilane belonging to a sub-class of high order silanes have low energy Si—Si bonds, thereby allowing, advantageously, for lower temperature epitaxial layer formation. This may further reduce the probability of stress relaxation in the epitaxial stack, particularly when the thickness of the epitaxial stack (200) is increased.

In some embodiments, other high order branched silanes that can be used may include 2-silylpentasilane, 2,2-disilyltetrasilane, 2-silyltrisilane, 2-silyltetrasilane, 3-silylpentasilane, 2,2-disilyltrisilane, 2,3-disilylpentasilane, 2,2,3-trisilylpentasilane, 2,3,4-trisilylpentasilane, 2,3,4-trisilylpentasilane, 2,3-disilyltetrasilane, 2,2,3,3-tetrasilyltetrasilane, 2-silylhexasilane, 3-silylhexasilane, 3,4-disilylhexasilane, 2,3-disilylpentasilane, 2,4-disilylhexasilane, 4-silylheptasilane, 2,2-disilylpentasilane, 3,3-disilylpentasilane, 3,3-disilylhexasilane, 2,2-disilylhexasilane, 2,3-disilylhexsilane, 2-silylheptasilane, 3-silylheptasilane, 2,5-disilylhexasilane, 2,3,3-trisilylpentasilane and combinations thereof.

In embodiments, the first deposition pulse may be carried out at a first deposition temperature, thereby forming the first epitaxial layer (20) and the second deposition pulse may be carried out at a second deposition temperature, thereby forming the second epitaxial layer (30).

In embodiments, the process chamber may be maintained at a temperature in the range of 300° C. to 600° C. Thus, in embodiments, both the first and the second deposition temperature may be at a temperature in the range of from at least 300° C. to at most 350° C., or from at least 350° C. to at most 400° C. or from at least 400° C. to at most 450° C. or from at least 450° C. to at most 500° C. or from at least 500° C. to at most 550° C. or from at least 550° C. to at most 600° C. Formation of the first (20) and the second epitaxial layer (30) at a temperature in the range of 300° C. to 600° C. may be advantageous as it may lead to a reduced probability of stress relaxation of the epitaxial layers as the thickness of the epitaxial stack is being increased. Additionally, it may provide the advantage of reducing uniformity issues across the substrate in terms of such as, for example, thickness non-uniformity.

The first deposition pulse and the second deposition pulse may be configured within this temperature range of 300° C. to 600° C. such that both the formation of the first epitaxial layer (20) and the formation of the second epitaxial layer (30) can be done substantially isothermal. Formation of different epitaxial layers (20, 30) under substantially isothermal conditions may provide the advantage of avoiding temperature ramp-ups and temperature ramp-downs during their formation. This may, in turn, lead to an increase in throughput of the epitaxial process since the rate of production can be increased. This may be due to the fact that part of process time which would otherwise be dedicated to the temperature ramp-ups and temperature ramp-downs, including the time for stabilization after reaching the desired temperature, can then be saved. Partial pressure of the first silicon-containing compound and/or the second silicon containing compound may be adjusted such that the growth rate of the first epitaxial layer (20) and/or the second epitaxial layer (30) obtained under substantially isothermal conditions can further be increased.

Furthermore, both deposition pulses may advantageously be performed in one and the same process chamber under substantially isothermal conditions, thereby avoiding transfer between different process chambers.

The measurement of deposition temperature may, in embodiments, be carried out by using a thermocouple, that is placed inside the process chamber. The thermocouple may be situated in an upper section of the process chamber and above an upper section of the wafer boat holding the plurality of substrates. In some embodiments, a plurality of thermocouples may be used. Each of the plurality of thermocouples may be placed at differing locations inside the process chamber for allowing a better temperature control inside the process chamber.

In embodiments, the temperature difference between an upper section of the process chamber and a lower section of the process chamber, during the first deposition and/or the second deposition may be about 2° C. or 3° C. It is to be understood that the upper section and the lower section of the process chamber may correspond to the neighborhood of the upper and lower portion of the wafer boat holding the plurality of substates.

In some embodiments, where the first silicon-containing compound may be a mono-silane or a high order straight chain silane and where the second silicon-containing compound may be a high order straight chain silane being the same or different than that of the first silicon-containing compound, and where the germanium-containing compound may be a mono germane or $GeCl_4$, both the first deposition pulse and the second deposition pulse may be carried out at a temperature in the range of 300° C. to 550° C. In these embodiments, both the first deposition temperature and the second deposition temperature may be at a temperature in the range of from at least 300° C. to at most 350° C. or from at least 350° C. to at most 400° C. or from at least 400° C. to at most 450° C. or from at least 450° C. to at most 500° C. or from at least 500° C. to at most 550° C. Performing both the first deposition and the second deposition in this narrow temperature range may provide the advantage of forming the first epitaxial layer (20) and the second epitaxial layer (30) substantially isothermal.

In an exemplary embodiment, the first silicon-containing compound may be a mono-silane and the second silicon-containing compound may be trisilane, while the germanium-containing compound may be a mono germane or a halo germane, whereby both the first deposition pulse and the second deposition pulse may be carried out at a temperature in the range of 450° C. to 550° C. This halo germane may, in these embodiments, be $GeCl_4$.

In another exemplary embodiment, the first and the second silicon-containing compound may be a mono-silane, while the germanium-containing compound may be a mono germane whereby both the first deposition pulse and the second deposition pulse may be carried out at a temperature in the range of 450° C. to 550° C.

In some embodiments, both the first and the second deposition temperature may be at a temperature in the range of 300° C. to 550° C., when the first silicon-containing compound comprised in the first semiconductor material precursors is a cyclic silane or a high order branched silane and when the germanium-containing compound comprised in the first semiconductor material precursors is $GeH_4$. In these embodiments, the second silicon-containing compound may be a mono-silane. The temperature may, in these embodiments, be in a range from at least 300° C. to at most 350° C. or from at least 350° C. to at most 400° C. or from at least 400° C. to at most 450° C. or from at least 450° C. to at most 500° C. or from at least 500° C. to at most 550°

C. In these embodiments, the cyclic silane may be cyclohexasilane and the high order branched silane may be neopentasilane.

The cyclic silane or the high order branched silane may, in alternative embodiments, be provided as the second silicon-containing compound comprised substantially in the second semiconductor material precursor as well as the first-silicon-containing compound. The cyclic silane comprised substantially in the second semiconductor material precursor may, in these embodiments, then be cyclohexasilane. The high order branched silane comprised substantially in the second semiconductor material precursor may, in these embodiments, also be neopentasilane. In this way, the formation of the epitaxial pairs (50) comprising the first (20) and the second (30) epitaxial layer may be carried out substantially isothermal at a temperature in the range of 300° C. to 480° C. This may provide the advantage of avoiding temperature ramp-ups and temperature ramp-downs when switching from the formation of the first epitaxial layer (20) to the formation of the second epitaxial layer (30). This may, in turn, lead to an increase in throughput of the epitaxial process since the rate of production can be increased. This may be due to the fact that part of process time which would otherwise be dedicated to the temperature ramp-ups and temperature ramp-downs can then be minimized.

In embodiments, the process chamber may be maintained at a pressure in the range of 0 Torr to 10 Torr. In embodiments, the pressure may be in the range of from at least 0 Torr to 2 Torr or from at least 2 Torr to 3 Torr or from at least 3 Torr to 4 Torr or from at least 4 Torr to 5 Torr or from at least 5 Torr to 6 Torr or from at least 6 Torr to 7 Torr or from at least 7 Torr to 8 Torr or from at least 8 Torr to 10 Torr.

In preferred embodiments, the pressure in the process chamber may be maintained at a pressure in the range of 200 mTorr to 10 Torr.

In yet preferred embodiments, the pressure in the process chamber may be maintained at a pressure in the range of 200 mTorr to 1 Torr.

Carrying out the formation of the epitaxial stack within this pressure rage may offer the advantage that wafer within non-uniformity (WIWNU) is optimized such that topographical variation across the surface of the substrates is minimized.

It is to be understood that the flow rates of the first semiconductor material precursors and the second semiconductor material precursor may be adjusted to tune their partial pressure inside the process chamber. This may help to adjust the concentration of each of the precursor gases in the process chamber. This may then allow for determining the growth rate of the epitaxial layers. Furthermore, it may allow for determining the atomic percentage of germanium in the first epitaxial layer (20).

In a second aspect of the present disclosure, the method of forming an epitaxial stack on a plurality of substrates may comprise providing the plurality of substrates to a process chamber. This process chamber may be extending in a longitudinal direction. This longitudinal direction may be a vertical direction or a horizontal direction. In embodiments, this process chamber may be comprised in a vertical processing furnace and thus, this process chamber may be extending in a vertical direction. The vertical furnace may provide the advantage of saving cleanroom space compared to a horizontal furnace, where the process chamber typically extends in a horizontal direction. Forming the epitaxial stack on the plurality of substrates may provide the advantage of increasing throughput of the epitaxial deposition process itself. This is due to the fact that wafer processing per unit time may be decreased thanks to the provision of the batch operation. Furthermore, this may further be advantageous in increasing the overall throughput of the semiconductor manufacturing process. The combination of having a vertical furnace and being able to process the plurality of substrates may advantageously allow for economic processing since plurality of substrates may be processed together in one and the same process run and in one and the same process chamber, while saving cleanroom space.

The plurality of substrates may, in embodiments, be semiconductor substrates. The semiconductor substrates may, in embodiments, comprise Si (111) substrates or a Si(100) substrates. The plurality of substrates may, in embodiments, comprise a semiconductor layer. This semiconductor layer may, in embodiments, be a Si(111) layer or a Si(100) layer. In embodiments, one or more surface layers may be present or may be formed on the substrates such as for example, oxides or nitrides including silicon oxide or silicon nitride. The epitaxial stack may be formed on the plurality of substrates. The formation of the epitaxial stack (200) may comprise a formation of a first epitaxial layer (20) alternatingly and repeatedly with a formation of a second epitaxial layer (30), thereby forming a plurality of epitaxial pairs (50). Each of the first epitaxial layers (20) may comprise a germanium concentration in the range of about 15 atomic % to about 30 atomic % and a silicon concentration in the range of about 70 atomic % to about 85 atomic % and each of the second epitaxial layers (30) may comprise a silicon concentration of about 100 atomic %, and the first epitaxial layer (20) may further comprise a dopant.

The presence of germanium in the first epitaxial layer (20) being in the range of 15 atomic % to 30 atomic % may provide the advantage of reducing lattice mismatch therefore, reducing a probability of lattice indices strain in the epitaxial stack. Furthermore, the presence of germanium in the first epitaxial layer (20) may have the advantage of enhancing the etch selectivity towards the second epitaxial layer (30).

In embodiments, each of the first epitaxial layers (20) may comprise a germanium concentration in the range of from at least 15 atomic % to at most 20 atomic % or from at least 20 atomic % to at most 25 atomic % or at least from 25 atomic % to at most 30 atomic % and a silicon concentration from at least 70 atomic % to at most 75 atomic % or from at least 75 atomic % to at most 80 atomic % or from at least 80 atomic % to at most 85 atomic %.

The presence of dopant that may be comprised in the first epitaxial layer (20) may allow for equilibrating the stress in this layer. This may then advantageously help for reducing the probability of stress build-up that may lead to stress relaxation in the epitaxial stack (200). This may be due to the fact that the presence of dopant that may be comprised in the first epitaxial layer (20) may advantageously help to reduce the lattice mismatch between the first epitaxial layer (20) and the second epitaxial layer (30).

The lattice mismatch, f, is given by the formula:

$$f = \frac{a\,SiGe - aSi}{aSi} \sim 0.042x \quad \text{(Eq. 1)}$$

where, x is the Ge concentration in atomic percentage in the first epitaxial layer (20).

The critical thickness, hc, for plastic relaxation is given by the formula:

$$hc = \frac{1.9 \times 10^{-2}}{f^2} \cdot \left(\ln\left(\frac{hc}{4}\right)\right) \qquad \text{(Eq. 2)}$$

Therefore, it is to be understood that incorporation of a dopant into the first epitaxial layer (20) may, advantageously, help to reduce the lattice mismatch between the first epitaxial layer (20) and the second epitaxial layer (30). Reduction of lattice mismatch may then help to avoid relaxation of the epitaxial layer. This may then advantageously lead to the formation of thicker epitaxial stacks.

For a germanium concentration of 30% atomic percentage, in exemplary embodiments, the lattice mismatch is around 1.26%, that may potentially lead to lattice induce strain of the epitaxial layer for thicker epitaxial stacks. Therefore, the lattice mismatch may need to be reduced below 1%, or preferably below 0.85%, or more preferably below 0.5% by the incorporation of a dopant.

In embodiments, the dopant in the first epitaxial layer (20) may reduce stress in the epitaxial stack (200). This may advantageously be due to the fact that the dopant in the first epitaxial layer (20) may allow for equilibrating the stress in the first epitaxial layers (20) of the epitaxial stack (200), thereby reducing a probability of stress build-up in the epitaxial stack (200). Absence of stress equilibration may lead to stress build up in the epitaxial stack (200), particularly when thicker epitaxial stacks are deposited on the plurality of substrates. This stress build-up may lead to substrate warpage or substrate bow. When substrate warpage or substrate bow exists, it may lead to challenges or even lead to problems, in the subsequent processing steps such as, for example, alignment problems in lithography, thickness variations across the substrate surface after further deposition processes, non-uniformities in etching originating from the thickness variations and wafer handling issues. These challenges or problems may run the risk of affecting process quality, decreasing process yield, decreasing process throughput and eventually an overall decrease in manufacturing yield and overall decrease in manufacturing throughput. Therefore, the presence of dopant in the first epitaxial layer (20) may advantageously help to alleviate these challenges or problems.

In embodiments, the epitaxial stack (200) may be a stress-poor epitaxial stack. This may be thanks to the reduced stress in the epitaxial stack (200) that is due to the presence of the dopant in the first epitaxial layers (20) of the epitaxial stack (200). The epitaxial stack (200) being a stress-poor epitaxial stack may advantageously minimize the risk for substrate warpage or substrate bow.

In embodiments, the number of epitaxial pairs (50) may be at least 50. This may provide the advantage of being able to process a semiconductor structure for forming a 3DDRAM device. In embodiments, the number of the plurality of epitaxial pairs (50) may go up to 550, but not limited thereto. Therefore, in some embodiments, the number of epitaxial pairs (50) may be at least from 50 to at most 150, or at least from 150 to at most 250 or at least from 250 to at most 350, or at least from 350 to at most 450 or at least from 450 to at most 550.

In embodiments, the first epitaxial layer (20) and the second epitaxial layer (30) may have the same thickness or a different thickness from one another.

In embodiments, at least one of the first epitaxial layer (20) or the second epitaxial layer (30) may have a thickness in the range of 5 nm to 50 nm. In embodiments, at least one of the first epitaxial layer (20) or the second epitaxial layer (30) may have a thickness in the range of from at least 5 nm to at most 15 nm, or from at least 15 nm to at most 20 nm, or from at least 20 nm to at most 25 nm, or from at least 25 nm to at most 30 nm, or from at least 30 nm to at most 35 nm, or from at least 35 nm to at most 40 nm, or from at least 40 nm to at most 45 nm, or from at least 45 nm to at most 50 nm.

In embodiments, the epitaxial stack (200) may have a thickness of at least 5 µm. In embodiments, the thickness of the epitaxial stack (200) may go up to 11 µm, but not limited thereto. Therefore, in embodiments, the thickness of the epitaxial stack (200) may be at least from 5 µm to at most 7 µm, or at least from 7 µm to at most 9 µm, or at least from 9 µm to at most 11 µm. It may be an advantage that this epitaxial stack (200) can be formed on the plurality of substrates with reduced probability of stress relaxation. It may further be an advantage that this epitaxial stack (200) can be formed on the plurality of substrates with minimized uniformity issues.

In embodiments, the dopant concentration in the first epitaxial layer (20) is less than 10 atomic %. This may provide the advantage of equilibrating the stress in the first epitaxial layer (20) therefore leading to a reduction in the probability of stress build-up in the epitaxial stack (200) formed.

In embodiments, the concentration of the dopant in the first epitaxial layer (20) may be from at least 1 atomic % to at most 10 atomic % or from at least 1 atomic % to at most 2 atomic % or from at least 2 atomic % to at most 4 atomic % or from at least 4 atomic % to at most 6 atomic % or from at least 6 atomic % to at most 8 atomic % or from at least 8 atomic % to at most 10 atomic %.

The concentration of the dopant in the first epitaxial layer (20) may play an important role in tuning the stress in the epitaxial stack (200), thereby reducing the probability of substrate warpage or substrate bow. The concentration of the dopant in the first epitaxial layer (20) may, advantageously, be configured such that its diffusion is limited within the first epitaxial layer (20) and that it, preferably, does not diffuse into the second epitaxial layer (30). The concentration of the dopant, preferably confined in the first epitaxial layer (20) may, advantageously, be configured further such that it allows for selective etching of the first epitaxial layer (20) with an etch selectivity as close to 1 as possible. Etch selectivity obtained may, advantageously, allow for controlling the etch rate, and may thus, help for obtaining an atomically lower surface roughness. The surface roughness can be measured by Atomic Force Microscopy (AFM).

Without wishing to be bound by theory, it is to be understood that at lower dopant concentrations, the diffusion constant of the dopant in the first epitaxial layer (20) may be considered as a constant at a given temperature. Therefore, the concentration of the dopant may be further configured for optimizing the extent of diffusion in the first epitaxial layer (30) depending on the dopant being a fast diffuser or a slow diffuser.

In embodiments, the dopant precursor gas may be at least one of a Group IIIA, a Group IVA or a Group VA element-containing compound. The dopant that may be incorporated into the first epitaxial layer (20) by at least one of these compounds may advantageously help for reducing the probability of substrate warpage or substrate bow by reducing the probability of the stress build-up throughout the epitaxial layer through equilibration of the stress in the first epitaxial layers (20) of the epitaxial stack (200).

In embodiments, the dopant precursor gas being at least one of the Group IIIA, the Group IVA or the Group VA element-containing compound may be mixed with a carrier gas. In other words, the carrier gas may be provided into the process chamber during a provision of the dopant precursor gas. This may advantageously help to dilute the dopant precursor gas, thereby providing better control of the dopant dose in the epitaxial layer. In embodiments, the inert gas may comprise substantially $N_2$. In some embodiments, the inert gas may comprise substantially of one or more noble gases such, for example, Ar, Ne, He, Xe and Kr. In some embodiments, the inert gas may comprise substantially of at least one of $N_2$ and one or more of noble gases.

In embodiments, the Group IIIA element-containing compound may be a boron-containing compound. Boron that will be incorporated in the first epitaxial layer (20) as the dopant is a dopant that is compatible with epitaxial growth and it can advantageously be incorporated when processing the plurality of substrates. In these embodiments, the boron-containing compound may be a borane, a boron halide or an alkylborane. The borane has a general formula of $B_xH_y$, wherein x and y are integers. In some embodiments, x is from at least 1 to at most 12. In embodiments the borane may include mono-borane, diborane, triborane, tetraborane and pentaborane or mixtures thereof. The alkylborane may, in embodiments, include dimethlyborane, diethylborane, trimethylborane, triethylborane, mixtures thereof or other alkyl boranes having a general formula of $R_xBH_{3-x}$, with R representing alkyl groups such as ethyl, methyl, butyl or propyl and with x ranging from 0 to 3.

In some embodiments, the boron halide has a general formula of $BX_3$, wherein X is a halogen. In embodiments, the boron trihalide may be $BCl_3$.

In some embodiments, the Group IIIA element-containing compound may be an aluminum-containing compound or a gallium-containing compound. The aluminum-containing compound or the gallium-containing compound may be halogenated and/or alkylated derivatives having a general formula of $R_nMX_{3-n}$, n being 0, 1, 2 or 3, M being aluminum or gallium and R being an alkyl group of ethyl, methyl, butyl or propyl and X being Cl or F. In these embodiments, aluminum-containing or gallium-containing compounds may be triethyl aluminum, trimethylaluminum, aluminum chloride, trimethyl aluminum chloride, triethylgallium, trimethylgallium, gallium chloride and dimethyl gallium chloride.

In embodiments, the Group IVA element-containing compound may be a carbon-containing compound. The carbon containing compound may, in some embodiments, be selected from alkanes, alkenes, alkynes, cyclic alkynes, cyclic alkenes, cyclic alkanes, aromatic hydrocarbons and derivatives thereof. In some embodiments, the carbon containing compound may be selected from alkanes, alkenes, alkynes, cyclic alkynes, cyclic alkenes, cyclic alkanes, aromatic hydrocarbons, and derivatives thereof, the alkyl group being ethyl, methyl, butyl and propyl.

The carbon-containing compound may, in embodiments be selected from the group consisting of CO, $CF_4$, $CH_2O$, $CH_4C_2F_4H_2$, $COF_2$ and $C_2H_4$.

In some embodiments, the carbon-containing compound may be $C_2H_4$. This may provide the advantage of allowing better carbon dopant incorporation into the epitaxial layer as it is particularly suitable for use at temperature ranges of forming the epitaxial stack (200).

In embodiments, the Group-VA element-containing compound may be a pnictogen hydride. The pnictogen hydride has a formula of $XH_3$, X being a pnictogen. In embodiments, the pnictogen hydride may be selected from the group consisting of arsine ($AsH_3$), phosphine ($PH_3$), stibine ($SbH_3$) and mixtures thereof. In some embodiments, alkylphosphines, having the formula $R_xPH_{3-x}$, where x ranges from zero to 3 and R is an alkyl selected from the group consisting of ethyl, methyl, butyl or propyl, may be used as the Group-VA element-containing compound. The arsenic or phosphorus dopant incorporated in the epitaxial layer, preferably in the first epitaxial layer (20), thus, is compatible with epitaxial growth and it can advantageously be incorporated when processing the plurality of substrates. In some embodiments, alkylphosphines may be selected from the group consisting of diethylphosphine, triethylphosphine, dimethylphosphine, trimethylphosphine and mixtures thereof.

In embodiments, the dopant may be selected from a group consisting of boron, arsenic, carbon and phosphorus. These dopants may provide the advantage of being compatible with epitaxial growth of layers on substrates.

It is to be understood that some dopant types may segregate to the surface of the first epitaxial layer (20) upon being incorporated into the first epitaxial layer (20). This may originate from the fact that the lattice parameter of the dopant atom and lattice parameter of at least one of the atoms making up the first semiconductor material comprised in the first epitaxial layer (20) may have a similar value. These dopant types may, however, be helpful in tuning the etch selectivity of the first epitaxial layer (20) towards the second epitaxial layer (30) in one of the subsequent processes.

In embodiments, the formation of the first epitaxial layer (20) may be done by a provision, into the process chamber, of a first reaction gas mixture comprised in a first deposition pulse. The provision of the first reaction gas mixture may comprise providing first semiconductor material precursors in the process chamber.

In embodiments, the formation of the second epitaxial layer (30) may be done by a provision, into the process chamber, of a second reaction gas mixture comprised in a second deposition pulse. The provision of the second reaction gas mixture may comprise providing a second semiconductor material precursor. The first deposition pulse and the second deposition pulse may be comprised in a deposition cycle that may be executed a plurality of times, thereby forming the first epitaxial layer (20) alternatingly and repeatedly with the second epitaxial layer (30), thus forming the plurality of epitaxial pairs (50) making up the epitaxial stack (200). The first epitaxial layer (20) may thus, comprise a first semiconductor material and the second epitaxial layer (30) may comprise a second semiconductor material being different than the first semiconductor material.

In embodiments, the first deposition pulse may be carried out at a first deposition temperature, thereby forming the first epitaxial layer (20) and the second deposition pulse may be carried out at a second deposition temperature, thereby forming the second epitaxial layer (30).

Therefore, in embodiments, the formation of the first epitaxial layer may comprise providing the first semiconductor material precursors, the first semiconductor material precursors comprising a germanium-containing compound and a first silicon-containing compound and the formation of the second epitaxial layer may comprise providing the second semiconductor material precursor, the second semiconductor material precursor comprising substantially a second silicon-containing compound.

In embodiments, the germanium-containing compound comprised in the first semiconductor material precursors may be a germane. In some embodiments, the germane may be a mono-germane. In some embodiments, the germane may be a high order germane. This higher order germane may be a di-germane ($Ge_2H_6$), a tri-germane ($Ge_3H_8$) or a tetra-germane ($Ge_4H_{10}$) as well as other higher order germanes having a general formula of $Ge_xH_{2x+2}$.

In some embodiments, the germane may be a halo-germane. This halo-germane has the formula $GeH_nX_{4-n}$, where X is a halogen such as, F, Cl, Br or I and where n is an integer from 0 to 3. Therefore, this halo-germane may, in embodiments, be a fluoro-germane, a chloro-germane, a bromo-germane or an iodo-germane. The chloro-germane may, in embodiments, be chosen from $GeCl_3H$, $GeCl_4$, $GeClH_3$, $GeCl_2H_2$, and $Ge_2ClH_5$.

Therefore, in embodiments, the germanium-containing compound may be at least one of a mono-germane or $GeCl_4$.

In embodiments, the dopant may be provided in the process chamber simultaneously during the formation of the first epitaxial layer (20). In other words, simultaneous provision may be referred to as co-flowing the dopant precursor gas together with the first reaction gas mixture into the process chamber. The simultaneous provision of the dopant precursor gas may advantageously allow for the dopant to be uniformly distributed throughout the first epitaxial layer (20) during its formation. This may be advantageous in terms of the doping characteristics such that a uniform doping profile and a uniform doping concentration can be achieved within the epitaxial layer as the epitaxial layer formation and the doping is happening at the same time.

Furthermore, the first epitaxial layer (20) is to be used as a sacrificial layer in the epitaxial stack (200). In other words, this first epitaxial layer (20) is to be removed from the epitaxial stack (200) during one of the subsequent processes. Therefore, while presence of the dopant in the first epitaxial layer (20) may be advantageous to level out the stress build-up throughout the epitaxial stack (200) by equilibrating the stress in the first epitaxial layer (20), the removal of the first epitaxial layer due to its being the sacrificial layer may advantageously leave no dopant in the semiconductor structure to be made through one of the subsequent processes. Furthermore, the presence of the dopant in the first epitaxial layer (20) may provide etch selectivity of the first epitaxial layer (20) towards the second epitaxial layer (30), thereby improving the etching process during the removal of the first epitaxial layer (20).

In some embodiments, the simultaneous provision of the dopant precursor gas may be configured such that the dopant concentration in the first (20) epitaxial layer is increasing towards the center in a direction extending away from its lower or from its upper interface towards the center, so that a gradual and opposing stress distribution can be obtained throughout the thickness of the first epitaxial layer (20). In other words, the concentration of the dopant may be graded within the first (20) epitaxial layer such that the dopant concentration is higher in the center portion of the first (20) epitaxial layer and the dopant concentration is lower in its upper portion and in its lower portion. This is schematically represented in FIG. 3.

This may advantageously help for accommodating the lattice mismatch between the first epitaxial layer (20) and the second epitaxial layer (30). Furthermore, it may advantageously allow for reducing the probability of diffusion of the dopant into the adjacent second epitaxial layers (30) at the top and at the bottom of the first epitaxial layer (20). Reducing the probability of diffusion of the dopant into the adjacent second epitaxial layer (30) at the top and at the bottom of the first epitaxial layer (20) may be advantageous since it may allow for maintaining the etch selectivity of the first epitaxial layer (20) towards the second epitaxial layer (30) when the second epitaxial layer (30) is to be removed from the epitaxial stack (200) in one of the subsequent processes.

In some embodiments, the simultaneous provision of the dopant precursor gas may be performed with the provision of the first reaction gas mixture in such a way that the concentration of the dopant, within the first (20) epitaxial layer (30), is increasing or decreasing along the epitaxial stack (200) extending away from an upper portion of the epitaxial stack (200) towards its lower portion. This is schematically represented in FIG. 4a and FIG. 4b, respectively.

This may allow for tailoring the etch characteristics of the first epitaxial layer (20) selectively towards the second epitaxial layer (30) in one of the subsequent processes. Despite the fact that the presence of dopant in the first epitaxial layer (20) enhances its etch selectivity towards the second epitaxial layer (30), some dopants may slow down the etch rate of the first epitaxial layer (20). Besides, etch behavior and thus the etch profile of the first epitaxial layer (20) may differ along the epitaxial stack as a function of the etch ambient that it is exposed to and as a function of the chamber that etching is taking place within, such as for example higher etching in the lower portion of the epitaxial stack compared to the upper position or vice versa. Therefore, a dopant concentration profile as schematically represented in FIG. 4a or FIG. 4b may help to compensate for these factors to allow for providing the etch selectivity of the first epitaxial layer (20) towards the second epitaxial layer (30), whereby a balanced etch behavior and thus a balanced etch profile regarding the etching of the first epitaxial layer (20) can be achieved throughout the epitaxial stack (200).

In alternative embodiments, the simultaneous provision of the dopant precursor gas may be performed in such a way that a group of epitaxial pairs (50) moving from the lower portion towards the center portion of the epitaxial stack (200), such as for example, from "n=1" to "n=x", x being the epitaxial pair (50) situated in the center or within the center portion of the epitaxial stack (200), may have a decreasing dopant concentration within the first (20) or the second (30) epitaxial layer, while another group of epitaxial pairs (50), moving from the center portion towards the upper portion of the epitaxial stack (200), such as for example, from "n=x+1" to "n=y", y being the top most epitaxial pair (50) of the epitaxial stack (200), may have an increasing dopant concentration within the first (20) or the second (30) epitaxial layer. In some embodiments, x is from at least 25 to at most 225 such as for example 64, 128, but not limited thereto. It is to be understood that x depends on the total number of epitaxial pairs in the epitaxial stack. Therefore, depending on the total number of epitaxial pairs x may correspond to the central epitaxial pair or may correspond to the epitaxial pair located within the central region of the epitaxial stack along its height. In some embodiments, y is from at least 50 to at most 550, such as for example 64, 128 or 256, but not limited thereto.

In other words, the dopant concentration within the first (20) or the second (30) epitaxial layer may change in an opposite behavior within the lower portion and the upper portion of the epitaxial stack (200) with reference to the center of the epitaxial stack (200). This is schematically represented in FIG. 5a.

In further alternative embodiments, the simultaneous provision of the dopant precursor gas may be performed in such a way that a group of epitaxial pairs (50), moving from the lower portion towards the center portion of the epitaxial stack (200), such as for example, from "n=1" to "n=x", x being the epitaxial pair (50) situated in the center or within the center portion of the epitaxial stack (200), may have an increasing dopant concentration within the first (20) or the second (30) epitaxial layer while another group of epitaxial pairs (50), moving from the center portion towards the upper portion of the epitaxial stack (200), such as, for example, from "n=x+1" to "n=y", y being the top most epitaxial pair (50) of the epitaxial stack (200), may have a decreasing dopant concentration within the first (20) or the second (30) epitaxial layer In some embodiments, x is from at least 25 to at most 225 such as for example 64, 128, but not limited thereto. It is to be understood that x depends on the total number of epitaxial pairs in the epitaxial stack. Therefore, depending on the total number of epitaxial pairs x may correspond to the central epitaxial pair or may correspond to the epitaxial pair located within the central region of the epitaxial stack along its height. In some embodiments, y is from at least 50 to at most 550, such as for example 64, 128 or 256, but not limited thereto.

In other words, the dopant concentration within the first (20) or the second (30) epitaxial layer may change in an opposite behavior within the lower portion and the upper portion of the epitaxial stack (200) with reference to the center of the epitaxial stack (200). This is schematically represented in FIG. 5b.

These alternative embodiments may offer the advantage of allowing for optimized etch integration when etching the first epitaxial layer (200) selective to the second epitaxial layer (30) in one of the subsequent processes. This may further be advantageous in cases, where enhanced etching may exist around the neighborhood of the upper and around the neighborhood of the lower portion of the epitaxial stack (200), which may be due to the etch ambient and/or the etch chamber. Thus, the higher (FIG. 5a) dopant concentration or the lower (FIG. 5b) dopant concentration in the first epitaxial layers (20) around the neighborhood of the upper and around the neighborhood of the lower portion of the epitaxial stack (200) may compensate for the etch rate difference of the first epitaxial layers (20) around the center of the epitaxial stack (200) having a lower (FIG. 5a) or a higher (FIG. 5b) dopant concentration.

In embodiments, the first silicon-containing compound comprised in the first semiconductor material precursors and/or the second silicon-containing compound comprised substantially in the second semiconductor material precursor may be a silane. The silane has a general molecular formula of $Si_nH_{2n+2}$, n being an integer from at least 1 to at most 20.

In some embodiments, the silane may be a mono-silane ($SiH_4$).

In embodiments, the first silicon-containing compound comprised in the first semiconductor material precursors and/or the second silicon-containing compound comprised substantially in the second semiconductor material precursor may be a high order silane. High order silanes have the advantage of forming epitaxial layers at lower temperatures. This is thanks to the presence of the low energy Si—Si bonds.

In embodiments, the first silicon-containing compound comprised in the first semiconductor material precursors and/or the second silicon-containing compound comprised substantially in the second semiconductor material precursor may be a cyclic silane. The cyclic silanes have a ring structure, thereby having lower Si—Si and Si—H bond strengths. This may therefore provide the advantage of forming epitaxial layers at lower temperatures. The cyclic silane or in other words, the cyclo-silane has a general molecular formula of $Si_nH_{2n}$, where n is an integer from at least 3 to at most 20, and it is a silane with a ring structure.

Therefore, in embodiments, the first silicon-containing compound comprised in the first semiconductor material precursors and/or the second silicon-containing compound comprised substantially in the second semiconductor material precursor may be a mono-silane, a high order silane or a cyclic silane.

In embodiments, the high order silane may be a high order straight chain silane or a high order branched silane.

The high order straight chain silane, has a general molecular formula of $Si_nH_{2n+2}$, n being an integer from at least 2 to at most 20 such as, for example, a di-silane ($Si_2H_6$), a trisilane ($Si_3H_8$), a tetra-silane ($Si_4H_{10}$), a pentasilane ($Si_5H_{12}$), a hexasilane ($Si_6H_{14}$), a heptasilane ($Si_7H_{16}$), octasilane ($Si_8H_{18}$), nonasilane ($Si_9H_{20}$), decasilane ($Si_{10}H_{22}$) or other high order straight chain silanes according to the general molecular formula of $Si_nH_{2n+2}$ and combinations thereof. In embodiments, the high order straight chain silane may be trisilane.

High order branched silanes have a general formula $Si_nH_{2n+2}$, where n is an integer from at least 4 to at most 20. The high order branched silane may, in embodiments, be neopentasilane. Neopentasilane belonging to a sub-class of high order silanes have low energy Si—Si bonds, thereby allowing, advantageously, for lower temperature epitaxial layer formation. This may further reduce the probability of stress relaxation in the epitaxial stack, particularly when the thickness of the epitaxial stack (200) is increased.

In some embodiments, other high order branched silanes can be used such as high order branched silanes described elsewhere herein.

In embodiments, the cyclic silane may be a cyclohexasilane. Cyclohexasilane is a high order silane, however it has a ring structure, thereby having lower Si—Si and Si—H bond strengths. This may therefore provide the advantage of forming epitaxial layers at lower deposition temperatures. By enabling the formation of epitaxial layers at lower deposition temperatures, may advantageously allow for reducing the probability of stress relaxation in the epitaxial stack, particularly when the thickness of the epitaxial stack is increased. Other cyclic silanes that may be used include cyclotrisilane ($Si_3H_6$), cyclotetrasilane ($Si_4H_8$), cyclopentasilane ($Si_5H_{10}$), cyclohexasilane ($Si_6H_{12}$), cycloheptasilane ($Si_7H_{14}$) or combinations thereof. Silyl substituted cyclic silanes may, in some embodiments, be used including silyl cyclotetrasilane, 1,2-disilylcyclopentasilane, 1,3-disilylcyclohexasilane, silylhexasilane and combinations thereof.

In some embodiments, the first silicon-containing compound or the second silicon-containing compound may be a combination of the mono-silane and at least one of the high order straight chain silanes.

In embodiments, the epitaxial stack (200) may be formed, in the process chamber, at a temperature in the range of 300° C. to 600° C. Thus, in embodiments, both the first and the second deposition temperature may be at a temperature in the range of from at least 300° C. to at most 350° C., or from at least 350° C. to at most 400° C. or from at least 400° C. to at most 450° C. or from at least 450° C. to at most 500° C. or from at least 500° C. to at most 550° C. or from at least 550° C. to at most 600° C. Formation of the first (20) and the second epitaxial layer (30) at a temperature in the range of 300° C. to 600° C. may be advantageous as it may lead to a reduced probability of stress relaxation of the epitaxial layers as the thickness of the epitaxial stack is being increased. Additionally, it may provide the advantage of reducing uniformity issues across the substrate in terms of such as, for example, thickness non-uniformity.

The measurement of deposition temperature may, in embodiments, be carried out by using a thermocouple, that is placed inside the process chamber. The thermocouple may be situated in an upper section of the process chamber and above an upper section of the wafer boat holding the plurality of substrates. In some embodiments, a plurality of thermocouples may be used. Each of the plurality of thermocouples may be placed at differing locations inside the process chamber for allowing a better temperature control inside the process chamber.

In embodiments, the temperature difference between an upper section of the process chamber and a lower section of the process chamber, during the first deposition and/or the second deposition may be about 2° C. or 3° C. It is to be understood that the upper section and the lower section of the process chamber may correspond to the neighborhood of the upper and lower portion of the wafer boat holding the plurality of substates.

The first deposition pulse and the second deposition pulse may be configured within this temperature range of 300° C. to 600° C. such that both the formation of the first epitaxial layer (20) and the formation of the second epitaxial layer (30) can be done substantially isothermal. Formation of different epitaxial layers (20, 30) under substantially isothermal conditions may provide the advantage of avoiding temperature ramp-ups and temperature ramp-downs during their formation. This may, in turn, lead to an increase in throughput of the epitaxial process since the rate of production can be increased. This may be due to the fact that part of process time which would otherwise be dedicated to the temperature ramp-ups and temperature ramp-downs, including the time for stabilization after reaching the desired temperature, can then be saved. Partial pressure of the first silicon-containing compound and/or the second silicon containing compound may be adjusted such that the growth rate of the first epitaxial layer (20) and/or the second epitaxial layer (30) obtained under substantially isothermal conditions can further be increased.

Furthermore, both deposition pulses may advantageously be performed in one and the same process chamber under substantially isothermal conditions, thereby avoiding transfer between different process chambers.

In some embodiments, where the first silicon-containing compound may be a mono-silane or a high order straight chain silane and where the second silicon-containing compound may be a high order straight chain silane being the same or different than that of the first silicon-containing compound, and where the germanium-containing compound may be a mono germane or $GeCl_4$, both the first deposition pulse and the second deposition pulse may be carried out at a temperature in the range of 300° C. to 550° C. In these embodiments, both the first deposition temperature and the second deposition temperature may be at a temperature in the range of from at least 300° C. to at most 350° C. or from at least 350° C. to at most 400° C. or from at least 400° C. to at most 450° C. or from at least 450° C. to at most 500° C. or from at least 500° C. to at most 550° C. Performing both the first deposition and the second deposition in this narrow temperature range may provide the advantage of forming the first epitaxial layer (20) and the second epitaxial layer (30) substantially isothermal.

In an exemplary embodiment, the first silicon-containing compound may be a mono-silane and the second silicon-containing compound may be trisilane, while the germanium-containing compound may be a mono germane whereby both the first deposition pulse and the second deposition pulse may be carried out at a temperature in the range of 480° C. to 520° C.

In another exemplary embodiment, the first and the second silicon-containing compound may be a mono-silane, while the germanium-containing compound may be a mono germane whereby both the first deposition pulse and the second deposition pulse may be carried out at a temperature in the range of 450° C. to 500° C.

In some embodiments, both the first and the second deposition temperature may be at a temperature in the range of 300° C. to 550° C., when the first silicon-containing compound comprised in the first semiconductor material precursors is a cyclic silane or a high order branched silane and when the germanium-containing compound comprised in the first semiconductor material precursors is $GeH_4$. In these embodiments, the second silicon-containing compound may be a mono-silane. The temperature may, in these embodiments, be in a range from at least 300° C. to at most 350° C. or from at least 350° C. to at most 400° C. or from at least 400° C. to at most 450° C. or from at least 450° C. to at most 500° C. or from at least 500° C. to at most 550° C. In these embodiments, the cyclic silane may be cyclohexasilane and the high order branched silane may be neopentasilane.

The cyclic silane or the high order branched silane may, in alternative embodiments, be provided as the second silicon-containing compound comprised substantially in the second semiconductor material precursor as well as the first-silicon-containing compound. The cyclic silane comprised substantially in the second semiconductor material precursor may, in these embodiments, then be cyclohexasilane. The high order branched silane comprised substantially in the second semiconductor material precursor may, in these embodiments, also be neopentasilane. In this way, the formation of the epitaxial pairs (50) comprising the first (20) and the second (30) epitaxial layer may be carried out substantially isothermal at a temperature in the range of 300° C. to 480° C. This may provide the advantage of avoiding temperature ramp-ups and temperature ramp-downs when switching from the formation of the first epitaxial layer (20) to the formation of the second epitaxial layer (30). This may, in turn, lead to an increase in throughput of the epitaxial process since the rate of production can be increased. This may be due to the fact that part of process time which would otherwise be dedicated to the temperature ramp-ups and temperature ramp-downs can then be minimized.

In embodiments, the process chamber may be maintained at a pressure in the range of 0 Torr to 10 Torr. In embodiments, the pressure may be in the range of from at least 0 Torr to 2 Torr or from at least 2 Torr to 3 Torr or from at least 3 Torr to 4 Torr or from at least 4 Torr to 5 Torr or from at least 5 Torr to 6 Torr or from at least 6 Torr to 7 Torr or from at least 7 Torr to 8 Torr or from at least 8 Torr to 10 Torr.

It is to be understood that the flow rates of the first semiconductor material precursors and the second semiconductor material precursor may be adjusted to tune their partial pressure inside the process chamber. This may help to adjust the concentration of each of the precursor gases in the process chamber. This may then allow for determining the growth rate of the epitaxial layers. Furthermore, it may allow for determining the atomic percentage of germanium in the first epitaxial layer (20).

In embodiments, the epitaxial stack may be formed in the process chamber at a pressure in the range of 200 mTorr to 10 Torr. In preferred embodiments, the pressure in the process chamber may be maintained at a pressure in the range of 200 mTorr to 1 Torr.

Carrying out the formation of the epitaxial stack within this pressure rage may offer the advantage that wafer within non-uniformity (WIWNU) is optimized such that topographical variation across the surface of the substrates is minimized.

Figure 6:
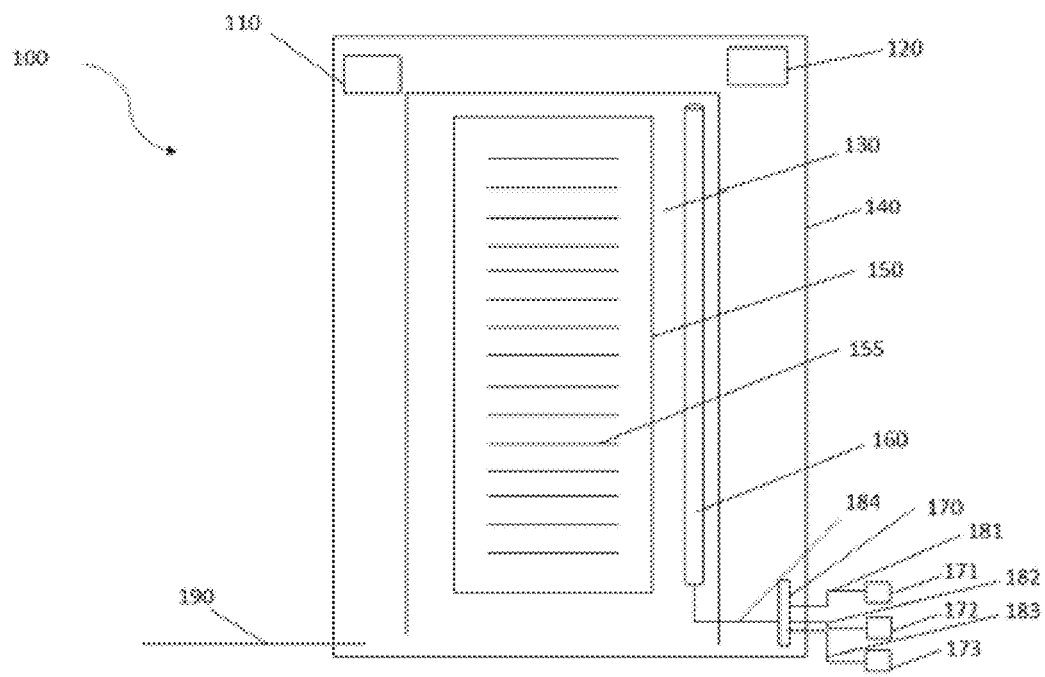
FIG. 6 shows a schematic representation of a wafer processing furnace according to embodiments of the third aspect of the present disclosure.

We now refer to FIG. 6 showing a schematic representation of a wafer processing furnace (100) configured to form an epitaxial stack (200) on a plurality of substrates according to embodiments of the first aspect or according to embodiments of the second aspect of the present disclosure.

The wafer processing furnace (100) may comprise a process chamber (130) extending in a vertical direction. It may comprise a wafer boat (150) for holding a plurality of substrates (155), the plurality of substrates (155) being vertically spaced apart. It may comprise a heater (120) configured for heating the process chamber (130). It may comprise a silane precursor storage module (171). The silane precursor storage module may comprise a mono-silane precursor, a high-order straight chain silane precursor, a high order branched silane precursor and a cyclic silane precursor. The wafer processing furnace (100) may also comprise a germane precursor storage module (172). The germane precursor storage module may comprise a mono-germane or a halo-germane precursor. The wafer processing furnace (100) may also comprise a dopant precursor storage module (173) comprising a dopant precursor. The dopant precursor may comprise a Group IIIA, a Group IVA or a Group VA element-containing compound. A gas providing manifold (170) may be comprised in this wafer processing furnace (100) that may be operationally connected to the silane precursor storage module (171), to the germane precursor storage module (172) and to the dopant precursor storage module (173). This gas providing manifold (170) may further be operationally connected to a gas injector (160). The gas injector (160) may be arranged for injecting the one or more silane precursors, the one or germane precursors and the dopant precursor into the process chamber (130).

In embodiments, the gas injector may be a single hole injector or a multiple hole injector.

In embodiments, more than one gas injector may be used for injecting the one or more silane precursors, the one or germane precursors and the dopant precursor into the process chamber (130). This may provide the advantage of obtaining uniform thickness of the epitaxial layers and uniform dopant concentration over the surface of the substrates. This may be thanks to the flat or, in other words, even distribution of the temperature over the wafer boat being the same in its top, center and bottom region. Furthermore, this may be advantageous in preventing depositions from occurring inside the gas injector.

In embodiments, it may be advantageous to use one or more single hole gas injector instead of the multiple hole injector. This may also provide the advantage of preventing depositions from occurring inside the gas injector.

It is to be understood that the one or more silane precursors, the one or germane precursors and the dopant precursor into the process chamber (130) may also be injected at the flange that may be located at a bottom region of the semiconductor processing apparatus.

In embodiments, the gas injector (560) may comprise a plurality of gas injection holes (not shown in the figure) being vertically spaced apart from one another. The gas injector may further comprise injector tubes (184) for supplying the precursors. The flow rate of each of the precursor gases flowing through the injector tubes may be adjusted such that their partial pressure inside the process chamber can be tuned. This may then allow for adjusting the concentration of each of the precursor gases in the process chamber, thereby further allowing for determining the growth rate of the different epitaxial layers.

The plurality of gas injection holes may provide the advantage of distributing the precursors in the process chamber (530). In embodiments, where the wafer processing furnace is a vertical furnace, the gas injection holes may then, be placed vertically spaced apart from one another.

In embodiments, the wafer processing furnace (100) may further comprise a controller (110) being configured for causing the wafer processing furnace (100) to provide the mono-silane precursor, the high-order straight chain silane precursor, the high order branched silane precursor or the cyclic silane precursor to the process chamber (130) and to provide the mono-germane or the halo-germane precursor, thereby forming a first epitaxial layer (20). The controller (110) may further be configured for causing the wafer processing furnace (100) to provide the mono-silane precursor, the high-order straight chain silane precursor, the high order branched silane precursor or the cyclic silane precursor to the process chamber, thereby forming a second epitaxial layer (30) on the first epitaxial layer (20). The controller (110) may further be configured for causing the wafer processing furnace (100) to provide the dopant precursor simultaneously during the formation of the first epitaxial layer. The silane precursor storage module (171) may be connected to the manifold (170) through the gas supply line (181). The germane precursors storage module (172) may be connected to the manifold (170) through the gas supply line (182). The dopant precursor storage module (173) may be connected to the manifold (170) through the gas supply line (183).

In embodiments, the wafer processing furnace (100) may further comprise an outlet (190), configured for letting an exhaust gas out of the process chamber (130), after processing is completed in the process chamber (130).

This wafer processing furnace (100) may be advantageous such that it allows for forming an epitaxial stack on a plurality of substrates, thereby increasing throughput of wafer processing.

The dopant precursor gas comprised in the dopant precursor storage module (173) may be provided into the process chamber together with the one or more silane precursors and/or one or more germane precursors during the formation of the first epitaxial layer. Incorporation of dopant into epitaxial layers that may be formed in this wafer processing furnace (100), particularly into epitaxial layers comprising a first semiconductor material comprising silicon and germanium being stacked alternatingly and repeatedly with epitaxial layer comprising a second semiconductor material being different than the first one and comprising silicon may advantageously allow for forming an epitaxial stack (200) on the plurality of substrates having a reduced possibility for substrate warpage or substrate bow.

The reduced possibility for substrate warpage or substrate bow may become important particularly when forming thicker epitaxial stacks. This is because thicker epitaxial stacks may be advantageous for the manufacturing of 3DDRAM devices. Thus, this wafer processing furnace (100) may be advantageous for the manufacturing of 3DDRAM devices. This may consequently contribute to the improvement of commercial success.

Processing carried out in this wafer processing furnace (100) may further allow for reducing cost of semiconductor processing. This may be due to the fact that a plurality of substrates may be processed together in one and the same process run and in one and the same process chamber.

As a result of processing in this wafer processing furnace (100), an epitaxial stack, on a plurality of substrates, may be formed at lower process temperatures. This may further minimize a probability of stress relaxation in the epitaxial stack. This may further provide the advantage of providing improved commercial success. By minimizing stress relaxation, the quality of subsequent process steps may be improved, such as for example, deposition processes, lithography processes.

In embodiments, the wafer processing furnace (100) may be a Chemical Vapor Deposition (CVD) furnace.

It is to be understood that the methods and the wafer processing furnace as disclosed according to different aspects of the present disclosure may allow for simultaneous processing of a plurality of substrates when forming an epitaxial stack comprising a plurality of epitaxial pairs. This may particularly be suited for semiconductor manufacturing, on one hand in an effort to enable the manufacturing of forthcoming device architectures and, on the other hand for improving throughput of manufacturing and reducing manufacturing costs.

An epitaxial stack, particularly a thicker one, provided on the plurality of substrates according to different aspects and different embodiments of the present disclosure may be beneficial for the manufacturing of 3DDRAM memory devices. Furthermore, an epitaxial stack provided on the plurality of substrates according to different aspects and different embodiments of the present disclosure may be beneficial for the manufacturing of SRAMs or MRAMs that are based on vertical nanowire/nanosheet gate-all-around field effect transistors.

The invention claimed is:

1. A method of forming an epitaxial stack on a plurality of substrates, the method comprising:
   providing the plurality of substrates to a process chamber; and
   executing a plurality of deposition cycles, thereby forming the epitaxial stack on the plurality of substrates, the epitaxial stack comprising a plurality of epitaxial pairs, wherein the epitaxial pairs each comprise a first epitaxial layer and a second epitaxial layer, the second epitaxial layer being different from the first epitaxial layer,
   wherein each deposition cycle, of the plurality of deposition cycles, comprises:
      a first deposition pulse comprising a provision of a first reaction gas mixture to the process chamber, thereby forming the first epitaxial layer, and
      a second deposition pulse comprising a provision of a second reaction gas mixture to the process chamber, the second reaction gas mixture being different from the first reaction gas mixture, thereby forming the second epitaxial layer;
   wherein the first deposition pulse or the second deposition pulse further comprises a provision of a dopant precursor gas to the process chamber; and
   wherein a dopant concentration in at least one of the first epitaxial layer and the second epitaxial layer:
      gradually increases from an upper surface of the at least one of the first epitaxial layer and the second epitaxial layer to a center of the at least one of the first epitaxial layer and the second epitaxial layer; and
      gradually decreases from the center of the at least one of the first epitaxial layer and the second epitaxial layer to a lower surface of the at least one of the first epitaxial layer and the second epitaxial layer.

2. The method according to claim 1, wherein the provision of the dopant precursor gas to the process chamber reduces stress in the epitaxial stack.

3. The method according to claim 1, wherein the provision of the dopant precursor gas is performed simultaneously with the provision of the first reaction gas mixture or simultaneously with the provision of the second reaction gas mixture.

4. The method according to claim 1, wherein
   the first epitaxial layer comprises a first semiconductor material and wherein the provision of the first reaction gas mixture comprises providing first semiconductor material precursors,
   the second epitaxial layer comprises a second semiconductor material being different than the first semiconductor material and wherein the provision of the second reaction gas mixture comprises providing a second semiconductor material precursor, and
   the dopant precursor gas is provided simultaneously with the provision of the first reaction gas mixture.

5. The method according to claim 1, wherein the dopant precursor gas is at least one of a Group IIIA, a Group IVA or a Group VA element-containing compound.

6. The method according to claim 4, wherein:
   the first semiconductor material precursors comprise a germanium-containing compound and a first silicon-containing compound, and
   the second semiconductor material precursor comprises substantially a second silicon-containing compound.

7. The method according to claim 6, wherein the germanium-containing compound comprised in the first semiconductor material precursors is at least one of mono-germane or a halo-germane.

8. The method according to claim 6, wherein the first silicon-containing compound comprised in the first semiconductor material precursors or the second silicon-containing compound comprised substantially in the second semiconductor material precursor is a mono-silane, a high order silane or a cyclic silane.

9. The method according to claim 8, wherein the high order silane is a high order straight chain silane or high order branched silane.

10. The method according to claim 9, wherein the high order straight chain silane is trisilane.

11. The method according to claim 9, wherein the high order branched silane is neopentasilane.

12. The method according to claim 8, wherein the cyclic silane is cyclohexasilane.

13. The method according to claim 1, wherein the process chamber is maintained at a temperature in a range of 300° C. to 600° C.

14. A method of forming an epitaxial stack on a plurality of substrates; the method comprising:
   providing the plurality of substrates to a process chamber; and
   forming the epitaxial stack on the plurality of substrates, comprising a formation of a first epitaxial layer alternatingly and repeatedly with a formation of a second epitaxial layer, thereby forming a plurality of epitaxial pairs, wherein:
   each of the first epitaxial layers comprises a germanium concentration in a range of about 15 atomic % to about 30 atomic % and a silicon concentration in a range of about 70 atomic % to about 85 atomic %;

each of the second epitaxial layers comprises a silicon concentration of about 100 atomic %; and a dopant concentration of a dopant in the first epitaxial layer:
- gradually increases from an upper surface of the first epitaxial layer to a center of the first epitaxial layer; and
- gradually decreases from the center of the first epitaxial layer to a lower surface of the first epitaxial layer.

15. The method according to claim 14, wherein a concentration of the dopant in the first epitaxial layer is less than 10 atomic %.

16. The method according to claim 14, wherein the dopant is provided in the process chamber simultaneously during the formation of the first epitaxial layer.

17. The method according to claim 14, wherein a number of epitaxial pairs is at least 50.

18. The method according to claim 14, wherein the formation of the first epitaxial layer comprises providing a first semiconductor material precursors, the first semiconductor material precursors comprising a germanium-containing compound and a first silicon-containing compound; and wherein the formation of the second epitaxial layer comprises providing a second semiconductor material precursor, the second semiconductor material precursor comprising substantially a second silicon-containing compound.

19. The method according to claim 18, wherein the first silicon-containing compound comprised in the first semiconductor material precursors or the second silicon-containing compound comprised substantially in the second semiconductor material precursor is a mono-silane, a high order silane or a cyclic silane.

* * * * *